(12) United States Patent
Kim et al.

(10) Patent No.: US 8,481,997 B2
(45) Date of Patent: Jul. 9, 2013

(54) ORGANIC LIGHT EMITTING DISPLAY DEVICE

(75) Inventors: Tae-Kyu Kim, Yongin (KR); Soon-Ryong Park, Yongin (KR); Chul-Woo Jeong, Yongin (KR); Woo-Suk Jung, Yongin (KR); Sung-Soo Koh, Yongin (KR); IL-Ryong Cho, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 377 days.

(21) Appl. No.: 12/987,049

(22) Filed: Jan. 7, 2011

(65) Prior Publication Data

US 2011/0175070 A1     Jul. 21, 2011

(30) Foreign Application Priority Data

Jan. 21, 2010   (KR) ........................ 10-2010-0005746

(51) Int. Cl.
*H01L 35/24* (2006.01)

(52) U.S. Cl.
USPC .................................... 257/40; 257/E51.001

(58) Field of Classification Search
USPC .......................................... 257/40, E51.001
See application file for complete search history.

(56) References Cited

U.S. PATENT DOCUMENTS

| | | | |
|---|---|---|---|
| 2003/0058387 A1 | 3/2003 | Fuenfschilling et al. |
| 2007/0235320 A1 | 10/2007 | White et al. |
| 2007/0261951 A1 | 11/2007 | Ye et al. |
| 2008/0129191 A1 | 6/2008 | Lee et al. |
| 2008/0157655 A1 | 7/2008 | Choi et al. |
| 2010/0002296 A1 | 1/2010 | Choi et al. |
| 2010/0019668 A1 | 1/2010 | Koo |

FOREIGN PATENT DOCUMENTS

| | | |
|---|---|---|
| JP | 2003-332068 | 11/2003 |
| KR | 2002-0079821 | 10/2002 |
| KR | 10-2006-0094250 A | 8/2006 |
| KR | 10-2007-0111037 A | 11/2007 |
| KR | 10-2007-0118765 | 12/2007 |
| KR | 10-2008-0041954 | 5/2008 |
| KR | 10-2008-0050899 | 6/2008 |
| KR | 10-2008-0061791 | 7/2008 |
| KR | 10-2009-0026067 | 3/2009 |
| KR | 10-2009-0026125 | 3/2009 |
| KR | 10-2009-0099248 | 9/2009 |
| WO | WO 01/57587 A1 | 8/2001 |
| WO | WO 2008-011222 A2 | 1/2008 |

OTHER PUBLICATIONS

KIPO Notice of Allowance dated Jan. 2, 2012, for corresponding Korean Patent Application No. 10-2010-0005746, listing Foreign Patent Document above, as well as KR 10-2008-0050899, KR 10-2008-0061791, and KR 10-2008-0041954, 5 pages.

*Primary Examiner* — Anthony Ho
(74) *Attorney, Agent, or Firm* — Christie, Parker & Hale, LLP

(57) ABSTRACT

An organic light emitting display device including: a substrate; an organic light emitting device on the substrate to display an image; a sealing member on the organic light emitting device; a phase delay layer disposed on the substrate, the organic light emitting device, or the sealing member; a linear polarization layer disposed on the substrate, the organic light emitting device, the sealing member, or the phase delay layer and is located closer to a display surface of the organic light emitting display where the image is displayed than the organic light emitting device, the sealing member, and the phase delay layer are from the display surface; a multi-phase delay layer between the phase delay layer and the linear polarization layer; and a transmittance control layer disposed on the substrate, the organic light emitting device, the sealing member, the phase delay layer, the multi-phase delay layer, or the linear polarization layer.

20 Claims, 16 Drawing Sheets

EXTERNAL LIGHT

EXTERNAL LIGHT

ORGANIC LIGHT EMITTING DISPLAY DEVICE

CROSS-REFERENCE TO RELATED APPLICATION

This application claims priority to and the benefit of Korean Patent Application No. 10-2010-0005746, filed on Jan. 21, 2010, in the Korean Intellectual Property Office, the entire content of which is incorporated herein by reference.

BACKGROUND

1. Field

The following description relates to an organic light emitting display device, and more particularly, to an organic light emitting display device that reduces external light reflection and increases internal light efficiency (internal light emission efficiency).

2. Description of Related Art

Recently, relatively thick and/or tube display devices have been replaced by thin and/or flat panel display devices so as to be portable. Among flat panel display devices, emissive organic or inorganic light emitting display devices are considered to be the next generation display devices due to their wide viewing angle, high contrast ratio, and short response time. Also, an organic light emitting display device, in which a material used to form a light emitting layer is an organic material, has advantages over an inorganic light emitting display device in terms of its high contrast, low driving voltage, and short response time, and can realize a color image.

As a method of realizing a color image, white light is produced and the white light is separated into the three primary colors by transmitting the white light through a color filter. However, in this method, an additional color filter must be attached.

SUMMARY

An aspect of an embodiment of the present invention is directed toward an organic light emitting display device capable of reducing external light reflection and/or increasing internal light efficiency (internal light emission efficiency).

According to an embodiment of the present invention, there is provided an organic light emitting display device including: a substrate; a sealing member; an organic light emitting device between the substrate and the sealing member and configured to display an image; a phase delay layer disposed with the substrate, the organic light emitting device, and the sealing member; a linear polarization layer disposed with the substrate, the organic light emitting device, the sealing member, and the phase delay layer and to be in a location closer to a display surface of the organic light emitting display where the image is displayed than the organic light emitting device, the sealing member, and the phase delay layer are from the display surface; a multi-phase delay layer between the phase delay layer and the linear polarization layer; and a transmittance control layer disposed with the substrate, the organic light emitting device, the sealing member, the phase delay layer, the multi-phase delay layer, and the linear polarization layer.

In one embodiment, the organic light emitting display device further includes a cholesteric liquid crystal (CLC) layer disposed with the substrate, the organic light emitting device, the sealing member, and the phase delay layer and to be in a location further away from the display surface than the phase delay layer is from the display surface. In one embodiment, the CLC layer is configured to transmit polarized light having a first rotation direction among inputted oval and/or circularly polarized light and to reflect polarized light having a second rotation direction.

In one embodiment, the transmittance control layer is configured to absorb incident light having visible wavelengths other than red (R), green (G), and blue (B) wavelengths.

In one embodiment, the transmittance control layer includes a material selected from the group consisting of polycarbonate (PC), Polymethyl Methacrylate (PMMA), polyethylene terephthalate (PET), polyethersulfone (PES), and triacetate cellulose.

In one embodiment, the transmittance control layer includes a material selected from the group consisting of azo group materials, azomethine group materials, diimmonium group materials, phthalocyanine group materials, anthraquinone group materials, indigo group materials, thioindigo group materials, dioxadine group materials, quinacridone group materials, isoindolinone group materials, metal oxide group materials, and metal complex compound materials.

In one embodiment, the multi-phase delay layer includes a plurality of delay layers respectively having differing optical axis angles.

In one embodiment, the multi-phase delay layer is configured to increase the polarity of incident light entering from its first side and to reduce the polarity of incident light entering from its second side.

In one embodiment, the phase delay layer is configured to delay an incident light with a delay value of $\lambda/4$.

In one embodiment, the organic light emitting display device is configured to realize the image in a direction to the substrate. In one embodiment, the linear polarization layer is on the substrate, the multi-phase delay layer is on the linear polarization layer, the phase delay layer is on the linear polarization layer, and the organic light emitting device is on the phase delay layer. In one embodiment, the linear polarization layer is on a first surface of the substrate, the multi-phase delay layer is on a second surface of the substrate opposite to the first surface on which the linear polarization layer is on, the phase delay layer is on the multi-phase delay layer, and the organic light emitting device is on the phase delay layer. In one embodiment, the organic light emitting device is on a first surface of the substrate and the linear polarization layer, the multi-phase delay layer, and the phase delay layer are sequentially disposed on a second surface of the substrate opposite to the first surface on which the organic light emitting device is on.

In one embodiment, the organic light emitting display device is configured to realize the image in a direction to the sealing member. In one embodiment, the organic light emitting display device further includes a passivation layer disposed with the phase delay layer, the multi-phase delay layer, and the linear polarization layer, the phase delay layer, the multi-phase delay layer, and the linear polarization layer being sequentially disposed on the organic light emitting device. In one embodiment, the organic light emitting display device further includes a reflection film between the substrate and the organic light emitting device, wherein the phase delay layer, the multi-phase delay layer, and the linear polarization layer are sequentially disposed between the reflection film and the organic light emitting device.

According to another embodiment of the present invention, there is provided an organic light emitting display device including: a substrate; a sealing member; an active matrix type organic light emitting unit that is between the substrate and the sealing member, the active matrix type organic light emitting unit being configured to display an image and comprising an organic light emitting device; a phase delay layer disposed with the substrate, the organic light emitting device, and the sealing member; a linear polarization layer disposed with the substrate, the organic light emitting device, the sealing member, and the phase delay layer and to be in a location closer to a display surface of the organic light emitting display where the image is displayed than the organic light emitting device, the sealing member, and the phase delay layer are from the display surface; a multi-phase delay layer between the phase delay layer and the linear polarization layer; and a transmittance control layer disposed with the substrate, the organic light emitting device, the sealing member, the phase delay layer, the multi-phase delay layer, and the linear polarization layer.

In one embodiment, the organic light emitting display device further includes a cholesteric liquid crystal (CLC) layer disposed with the substrate, the organic light emitting device, the sealing member, and the phase delay layer and to be in a location further away from the display surface than the phase delay layer is from the display surface. In one embodiment, the CLC layer is configured to transmit polarized light having a first rotation direction among inputted oval and/or circularly polarized light and to reflect polarized light having a second rotation direction.

According to another embodiment of the present invention, there is provided an organic light emitting display device including: a substrate; a sealing member; a thin film transistor (TFT) electrically connected to an organic light emitting device, the TFT and the organic light emitting device being between the substrate and the sealing member; a phase delay layer disposed with the substrate, the organic light emitting device, and the sealing member; a linear polarization layer disposed with the substrate, the organic light emitting device, the sealing member, and the phase delay layer and to be in a location closer to a display surface of the organic light emitting display where the image is displayed than the organic light emitting device, the sealing member, and the phase delay layer are from the display surface; a multi-phase delay layer between the phase delay layer and the linear polarization layer; and a transmittance control layer disposed with the substrate, the organic light emitting device, the sealing member, the phase delay layer, the multi-phase delay layer, and the linear polarization layer.

In one embodiment, the organic light emitting display device further includes a cholesteric liquid crystal (CLC) layer disposed with the substrate, the organic light emitting device, the sealing member, and the phase delay layer and to be in a location further away from the display surface than the phase delay layer is from the display surface. In one embodiment, the CLC layer is configured to transmit polarized light having a first rotation direction among inputted oval and/or circularly polarized light and to reflect polarized light having a second rotation direction.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

The present invention will now be described more fully with reference to the accompanying drawings in which exemplary embodiments of the invention are shown.

Figure 1:
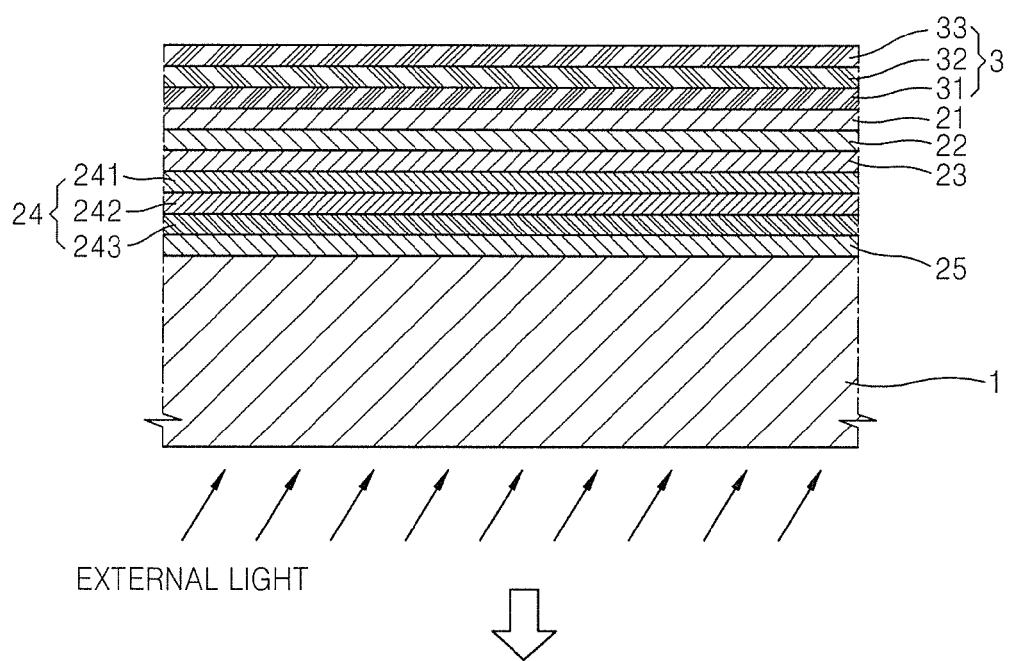
FIG. 1 is a cross-sectional view of an organic light emitting display device according to an embodiment of the present invention.

FIG. 1 is a cross-sectional view of an organic light emitting display device according to an embodiment of the present invention. Referring to FIG. 1, the organic light emitting display device includes a substrate 1, a linear polarization layer 25, a multi-phase delay layer 24, a transmittance control layer 23, a phase delay layer 22, a cholesteric liquid crystal (CLC) layer 21, and an organic light emitting device 3.

In one embodiment, the organic light emitting device 3 may further include a sealing member such as glass, a thin film member, or a metal cap that seals the organic light emitting device 3 from an external environment.

The substrate 1 may be a transparent glass material with $SiO_2$ as a main component. In one embodiment, the substrate 1 may further include a buffer layer to provide layer smoothness and/or to protect the substrate 1 from foreign impurity elements that may penetrate. The buffer layer may be formed of $SiO_2$ and/or $SiN_x$, (where x is an integer). The substrate 1 according to an embodiment of the present invention is not limited thereto, and may also be formed of a transparent plastic material.

The linear polarization layer 25 may be disposed on the substrate 1, and the multi-phase delay layer 24 may be disposed on the linear polarization layer 25. The transmittance control layer 23 may be disposed on the multi-phase delay layer 24, and the phase delay layer 22 may be disposed on the transmittance control layer 23. The CLC layer 21 may be disposed on the phase delay layer 22, and the organic light emitting device 3 may be disposed on the CLC layer 21. In addition, an optical transmittance layer may be interposed between each of the layer pairs described above.

The stacking sequence of the linear polarization layer 25, the multi-phase delay layer 24, the transmittance control layer 23, the phase delay layer 22, and the CLC layer 21 may be such that the linear polarization layer 25 is disposed close to a surface on which an image is displayed, and the multi-phase delay layer 24, the phase delay layer 22, and the CLC layer 21 may be sequentially disposed between the linear polarization layer 25 and the organic light emitting device 3.

Here, the direction in which an image is displayed denotes the direction in which the organic light emitting device 3 displays an image on the organic tight emitting display device. That is, the direction in which an image is displayed denotes a direction in which internal light generated from the organic light emitting device 3 is emitted to the outside and a direction towards a surface of the organic light emitting display device where an image is displayed. Also, the direction in which an image is displayed denotes the direction to a position of a surface of the organic light emitting display device where external light enters into the organic light emitting display device or where the external light reflects. That is, in FIG. 1, a first surface through which external light enters into the organic light emitting display device as indicated by arrows is the surface where an image is displayed, and a direction facing the first surface is the direction in which an image is displayed. Hereinafter, in FIGS. 1, 6, 7, 10, 12, 13, 14, 15, 16, 17, 18, 19, and 20, a surface through which external light enters as indicated by arrows is the surface on which an image is displayed, and a direction facing the surface where an image is displayed is the direction in which an image is displayed. Also, in FIGS. 21, 22, and 23, a surface through which internal light emits to the outside is the surface where an image is displayed, and a direction facing the surface where an image is displayed is the direction in which an image is displayed.

In this case, the transmittance control layer 23 may be disposed between the linear polarization layer 25 and the CLC layer 21. That is, the transmittance control layer 23 may be disposed between the linear polarization layer 25 and the multi-phase delay layer 24. Also, the transmittance control layer 23 may be disposed between the multi-phase delay layer 24 and the phase delay layer 22. Also, the transmittance control layer 23 may be disposed between the phase delay layer 22 and the CLC layer 21.

Figure 2:
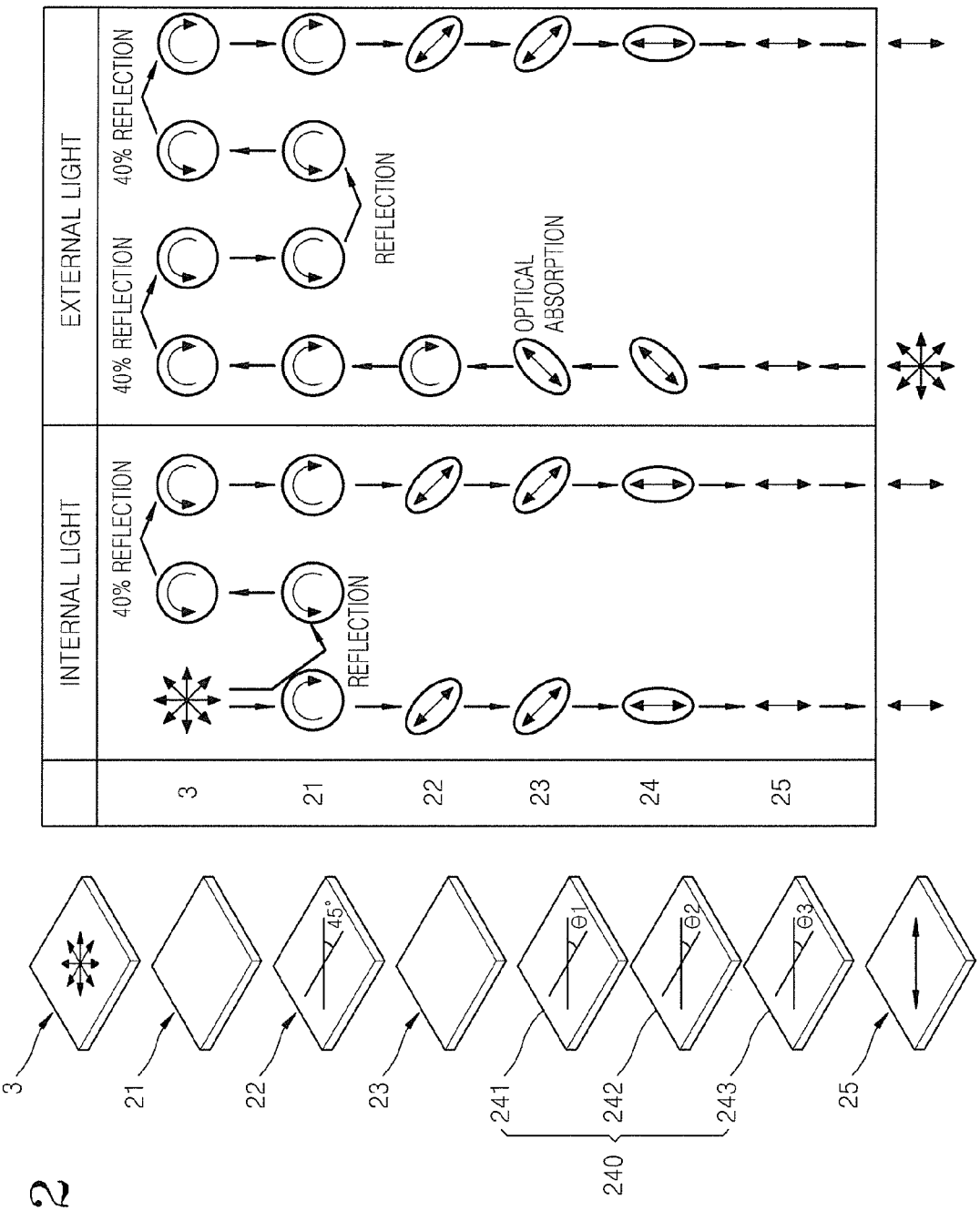
FIG. 2 is a conceptual view of polarized states of internal and external lights according to an embodiment of the present invention.

FIG. 2 is a conceptual view of polarized states of internal and external lights according to an embodiment of the present invention. Referring to FIG. 2, the organic light emitting display device of FIG. 1 according to an embodiment of the present invention will now be described in more detail. First, how internal and external lights pass through each of the layers will be described, and afterwards, the configuration and functions of each of the layers will be described.

In the case of internal light, the internal light is emitted in random directions as polarized light. At the CLC layer 21, one of left-hand and right-hand circularly polarized light lights of the internal light is transmitted and the other circularly polarized light is reflected. Here, when the circularly polarized light is reflected by the CLC layer 21, the circularly polarized light can be reflected without changing the phase of inputted light. In FIG. 2, it is assumed that the CLC layer 21 transmits the right-hand circularly polarized light and reflects the left circularly polarized light. The function of the CLC layer 21 is not limited thereto, and the CLC layer 21 can also transmit left-hand circularly polarized light and reflect the right-hand circularly polarized light. The right-hand circularly polarized light that passes through the CLC layer 21 is changed to a linear polarized light by passing through the phase delay layer 22. The linear polarized light that passes through the phase delay layer 22 also passes through the transmittance control layer 23. The transmittance control layer 23 transmits, for example, R, G, and B wavelengths, and can absorb approximately 50% of wavelengths between the R and G and G and B wavelengths except for peaks of the R, G, and B wavelengths. At this point, the organic light emitting device 3 emits lights respectively having mainly R, G, and B wavelengths, and therefore, lights can be passed through the transmittance control layer 23 without a great loss of light. Of course, the transmittance control layer 23 may be configured in various other suitable ways. The internal light that passes through the transmittance control layer 23 is then changed into a further linear polarized light state by passing through the multi-phase delay layer 24. The linear polarized light that passes through the multi-phase delay layer 24 is emitted to the outside through the linear polarization layer 25. On the other hand, the left-hand circularly polarized light of the internal light emitted from the organic light emitting device 3 is reflected by the CLC layer 21. The left-hand circularly polarized light that entered into the organic light emitting device 3 is reflected by a second electrode layer 33 of the organic light emitting device 3. When the left-hand circularly polarized light is reflected, the left-hand circularly polarized light rotating in the left direction becomes a right-hand circularly polarized light rotating in the right direction. Also, the second electrode layer 33 has a reflectance of approximately 40%, and thus, absorbs approximately 60% of light. Also, in FIG. 2, the left-hand circularly polarized light is changed into the right-hand circularly polarized light by being reflected by the second electrode layer 33 of the organic light emitting device 3. The right-hand circularly polarized light may then pass through the CLC layer 21. The right-hand circularly polarized light that passed through the CLC layer 21, as described above, is emitted to the outside by passing through the phase delay layer 22, the transmittance control layer 23, the multi-phase delay layer 24, and the linear polarization layer 25. In the case of the internal light, the left-hand circularly polarized light reflected by the CLC layer 21 can be emitted to the outside by reflecting at a reflectance of approximately 40% by the second electrode layer 33, and thus, an internal light efficiency (internal light emission efficiency) can be increased to approximately 70%.

In the case of external light, polarized lights of random directions enter the organic light emitting device 3 through the linear polarization layer 25. At this point, since the linear polarization layer 25 transmits a linearly polarized light that oscillates according to a vector of a direction and absorbs polarized lights in other directions, approximately 50% of the external light transmitting through the linear polarization layer 25 is absorbed. Thus, the linear polarization layer 25 has an effect of reducing external light that is reflected. The linearity of the linearly polarized light that passes through the linear polarization layer 25 is reduced by passing through the multi-phase delay layer 24 and is changed into circularly polarized light. Also, when the external light passes through the transmittance control layer 23, an optical absorption at wavelengths of the external light, except for the R, G, and B wavelengths, occurs. Unlike the internal light in which the R, G, and B constitute main wavelengths, since all other colors including the R, G, and B wavelengths are uniformly mixed in the external light, wavelengths of other colors, except for the R, G, and B wavelengths of the external light, are absorbed in the transmittance control layer 23. The external light that had losses when passing through the linear polarization layer 25 and the transmittance control layer 23 changes into a circularly polarized light by passing through the CLC layer 21. The external light that passes through the CLC layer 21 may be changed into a left-hand circularly polarized light or a right-hand circularly polarized light according to the control of the CLC layer 21. Here, in FIG. 2, the external light is changed into a right-hand circularly polarized light. The right-hand circularly polarized light, through the CLC layer 21, is reflected by the second electrode layer 33 of the organic light emitting device 3. Here, the second electrode layer 33 has a reflectance of approximately 40%, and thus, absorbs approximately 60% of entering light. Of course, the reflectance of the second electrode layer 33 can be controlled by changing the composition of the second electrode layer 33. Approximately 40% of the right-hand circularly polarized light of entering external light is reflected by the second electrode layer 33, and the right-hand circularly polarized light becomes a left-hand circularly polarized light by changing its phase. The left-hand circularly polarized light is re-reflected by the CLC layer 21 and the external light that is secondly reflected by the second electrode layer 33 changes from a left-hand circularly polarized light to a right-hand circularly polarized light. Here, 60% of the external light is absorbed in the second electrode layer 33 and the remaining 40% of the external light passes through the CLC layer 21 as a right-hand circularly polarized light. The right-hand circularly polarized light that passes through the CLC layer 21 is emitted to the outside through the phase delay layer 22, the transmittance control layer 23, the multi-phase delay layer 24, and the linear polarization layer 25. Here, 50% of the inputted external light is absorbed in the linear polarization layer 25, the remaining 50%, except for the R, G, and B wavelengths, is absorbed in the transmittance control layer 23, and, when the external light is reflected twice (i.e., two times) by the second electrode layer 33, 60% absorption occurs in each of the two times. Therefore, the final reflection of external light can be reduced to be below 4%. Thus, the reflection of external light can be reduced and contrast can further be increased.

The organic light emitting device 3, the CLC layer 21, the phase delay layer 22, the transmittance control layer 23, the multi-phase delay layer 24, and the linear polarization layer 25 will now be described in more detail.

The organic light emitting device 3 includes a first electrode layer 31, the second electrode layer 33 facing the first electrode layer 31, and a light emitting layer 32 interposed between the first and second electrode layers 31 and 33. The first electrode layer 31 may be formed of a transparent conductive material such as ITO, IZO, $In_2O_3$, or ZnO and formed to have a set or predetermined pattern using a photolithography method. When the organic light emitting device 3 is a passive matrix (PM) type, the pattern of the first electrode layer 31 may be formed in stripe shape lines separated by a set or predetermined distance. When the organic light emitting device 3 is an active matrix (AM) type, the pattern of the first electrode layer 31 may be formed to correspond to a pixel. In the case of the AM type, the substrate 1 under the first electrode layer 31 may further include a thin film transistor (TFT) layer having at least one TFT, and the first electrode layer 31 is electrically connected to the TFT layer.

The first electrode layer 31, which is a transparent electrode, may function as an anode electrode by being connected to an external terminal.

The second electrode layer 33 is disposed on the first electrode layer 31, and the second electrode layer 33 may be a reflection type electrode, may be formed of Ag, and/or Ca, and may function as a cathode by being connected to a second electrode terminal.

When the organic light emitting device 3 is a PM type, the second electrode layer 33 may be formed in stripe shape lines perpendicular to (or crossing) the lines of the first electrode layer 31, and when the organic light emitting device 3 is an AM type, the second electrode layer 33 may be formed to correspond to a pixel. When the organic light emitting device 3 is an AM type, the second electrode layer 33 may be formed across an overall active region where an image is displayed, which will be described later in more detail.

Here, the polarities of the first electrode layer 31 and the second electrode layer 33 may be reversed.

The light emitting layer 32 interposed between the first electrode layer 31 and the second electrode layer 33 emits light according to the electrical driving of the first electrode layer 31 and the second electrode layer 33. The light emitting layer 32 may be formed of a low molecular weight organic material or a polymer organic material.

Here, when the light emitting layer 32 is a low molecular weight organic material layer formed of a low molecular weight organic material, a hole transport layer (HTL) and a hole injection layer (HIL) can be stacked in a direction towards the first electrode layer 31 from an organic emission layer (EML), and an electron transport layer (ETL) and an electron injection layer (EIL) can be stacked in a direction towards the second electrode layer 33 from the EML. Of course, the low molecular weight organic material layer may be of stacking various layers besides the HIL, HTL, ETL, and EIL, as necessary.

An organic material that can be used to form the low molecular weight organic material layer includes copper phthalocyanine (CuPc), N,N'-Di(naphthalene-1-yl)-N,N'-diphenyl-benzidine (NPB), and tris-8-hydroxyquinoline aluminum (Alq3), but is not limited thereto.

When the light emitting layer 32 is a polymer organic material layer formed of a polymer organic material, only the HTL can be included in the direction towards the first electrode layer 31. The polymer HTL may be formed on the first electrode layer 31 and formed of poly-(2,4)-ethylene-dihydroxy thiophene (PEDOT) or polyaniline (PANI) using an inkjet printing method or a spin coating method. The polymer organic EML may be formed of PPV, Soluble PPV's, cyano-PPV, and/or polyfluorene, and a color pattern of the polymer EML may be formed using an inkjet printing method, a spin coating method, and/or a thermal transfer method using a laser.

The CLC layer 21 will now be described in more detail. The CLC layer 21 may be a molecular layer having a structure in which molecules are arranged in a helical shape. According to the arrangement of molecules, such a structure may transmit linearly polarized light and may reflect a circularly polarized light having a certain direction. Therefore, the CLC layer 21 can have a function of separating circularly polarized light and selectively reflect a circularly polarized light having a set or predetermined wavelength and a set direction of rotation. That is, the CLC layer 21 may selectively reflect a circularly polarized light having a wavelength equal to a helical pitch of the liquid crystal and a rotation direction as the same direction as the rotation direction of the liquid crystal, and may transmit the remaining other light. Therefore, when the molecule arrangement of the CLC layer 21 is a right-hand helical type, the CLC layer 21 reflects inputted polarized light of a right-hand circularly polarized light, and, when the molecule arrangement of the CLC layer 21 is a left-hand helical type, the CLC layer 21 reflects inputted polarized light of a left-hand circularly polarized light. In the current embodiment, for convenience of explanation, a case in which the CLC layer 21 transmits a right-hand circularly polarized light and reflects a left-hand circularly polarized light is described as an example; however, the configuration of the CLC layer 21 is not limited thereto, and the CLC layer 21 can be configured to reflect a right-hand circularly polarized light and to transmit a left-hand circularly polarized light. The cholesteric liquid crystal compound typically includes chiral molecules, and may be in polymer forms. The cholesteric liquid crystal compounds typically include molecular units that are chiral in nature and molecular units that are mesogenic in nature (for example, shows liquid crystal phases). Cholesteric liquid crystal compounds include compounds having a cholesteric liquid crystal phase in which a director of a liquid crystal rotates in a helical fashion along the dimension direction that is perpendicular to the director of the liquid crystal. The cholesteric liquid crystal compound may be selected in consideration of a specific application field or an optical body based on at least one factor including, for example, index of reflection, pitch, process suitability, transparency, color, a low absorption rate at a specific wavelength, compatibility with other components (for example, a Nematic liquid crystal compound), ease of manufacture, availability of liquid crystal compounds or monomers that constitute a liquid crystal polymer, rheology, method and requirement of curing, easiness of removing a solvent, physical and chemical properties (for example, flexibility, tensile strength, solvent resistance, scratch resistance, and phase change temperature), and economic feasibility.

The phase delay layer 22 will now be described in more detail. The phase delay layer 22 changes a circularly polarized light that has passed with a ¼ wavelength retarder to a linearly polarized light. The phase delay layer 22 may be formed by orienting a birefringence film. For example, the phase delay layer 22 may be formed of an inorganic material by using a slope deposition method. In this case, fine columns can be formed to be extended in a slope direction on a surface of the phase delay layer 22. These fine columns are the directions of crystal growth. When an inorganic material is deposited, the inorganic material grows in a cylindrical shape. Accordingly, in the case of a slope deposition, the cylindrical shape is inclined with a set or predetermined angle with respect to a horizontal direction. Thus, the phase delay layer 22 can have birefringence characteristics. The phase delay layer 22 may be formed of various inorganic materials such as $TiO_2$ or TaOx; however, in the current embodiment of the present invention, the phase delay layer 22 is formed of CaO and/or BaO to provide a moisture absorption function.

The transmittance control layer 23 will now be described in more detail. The transmittance control layer 23 can absorb light having a specific wavelength. Carbon black is used as a typical optical absorption material; however, in the current embodiment, the optical absorption material is not limited thereto and may include black inorganic materials, organic materials, colorants, and/or metals. An adhesive layer having a selective optical absorption function may include polycarbonate (PC), Polymethyl Methacrylate (PMMA), polyethylene terephthalate (PET), polyethersulfone (PES), and/or triacetate cellulose. Also, in one embodiment, the adhesive layer having the selective optical absorption function includes a selective optical absorption material selected from the group consisting of azo group materials, azomethine group materials, diimmonium group materials, phthalocyanine group materials, anthraquinone group materials, indigo group materials, thioindigo group materials, dioxadine group materials, quinacridone group materials, isoindolinone group materials, metal oxide group materials, and metal complex compound materials.

Figure 3:
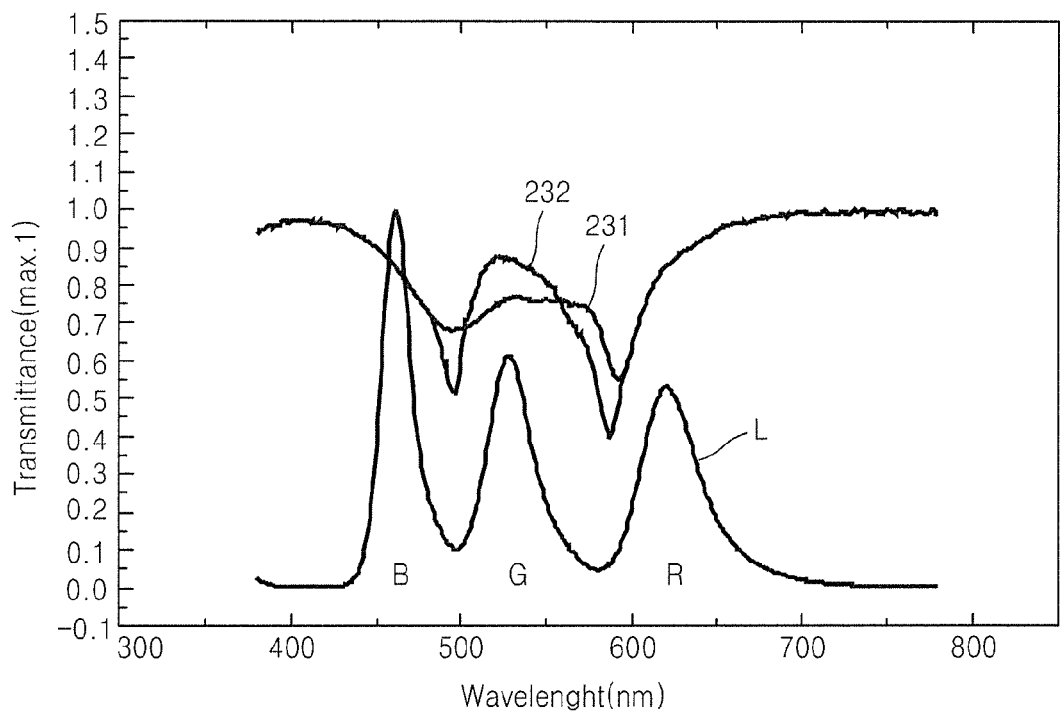
FIG. 3 is a graph showing the comparison of spectrums of natural light that passes through a transmittance control layer to internal light emitted from an organic light emitting device.

FIG. 3 is a graph showing the comparison of spectrums of natural light that passes through the transmittance control layer 23 to internal light L emitted from the organic light emitting device 3. The organic light emitting device 3 generates internal light L having R, G, and B wavelengths as main components. A first graph 231 and a second graph 232 respectively show the absorption characteristics of natural light after passing through a transmittance control layer 23 formed of an optical absorption material. Referring to the first and second graphs 231 and 232 of FIG. 3, when natural light passes through the transmittance control layer 23 formed of an optical absorption material, wavelengths between the R and G and G and B are absorbed. That is, an upper region divided by the graphs of the first graph 231 and the second graph 232 is an absorbed region, and a lower region divided by the first graph 231 and the second graph 232 is a transmitted region. Here, the first graph 231 and the second graph 232 respectively show matching ratios of 76.4% and 80.6% with respect to the R, G, and B wavelengths. Thus, when the light absorbed in the transmittance control layer 23 has a wavelength close to the R, G, and B wavelengths, the loss of internal light can be reduced and the absorption of external light can be increased. In this way, the transmittance control layer 23 prevents or reduces internal light loss by emitting R, G, and B wavelengths of the internal light without loss, and can reduce the reflection of external light by absorbing wavelengths of the external light, except for the R, G, and B wavelengths.

Figure 4:
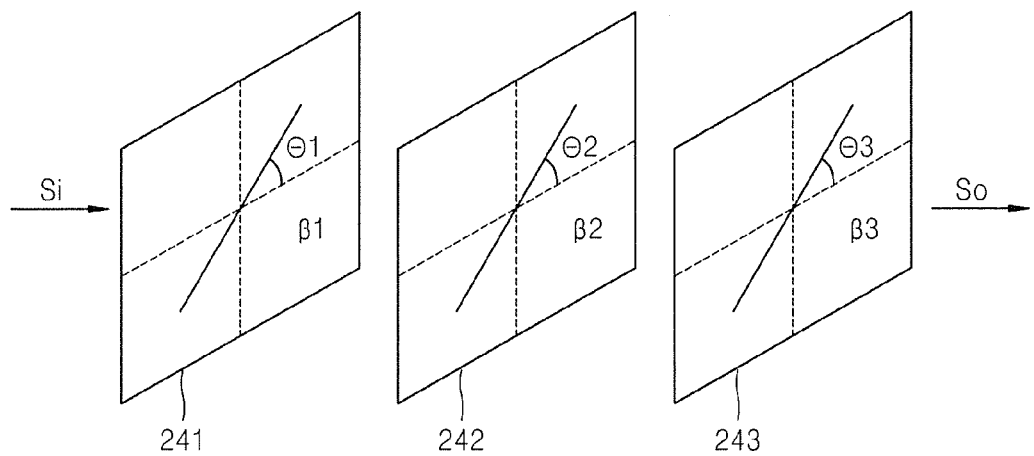
FIG. 4 is a schematic perspective view of a multi-phase delay layer having first, second, and third delay layers.

The multi-phase delay layer 24 will now be described in more detail. The multi-phase delay layer 24 has a stack structure in which optical axes of at least two delay planes formed of organic thin films having birefringence characteristics cross each other. FIG. 4 is a schematic perspective view of the multi-phase delay layer 24 having first, second, and third delay layers 241, 242, and 243. Here, the first, second, and third delay layers 241, 242, and 243 have optical axes of $\theta_1$, $\theta_2$, and $\theta_3$, respectively, and have phase delay values of $\beta_1$, $\beta_2$, and $\beta_3$, respectively. Thus, an inputted polarized light can be changed into a desired state of polarized light by passing through the multi-phase delay layer 24. The polarized state of an inputted polarized light is expressed as Formula 1 and Formula 2 below.

$$E_x(t) = \vec{i} E_{0x}(t) \cos[\overline{k}z - \overline{w}t) + \epsilon_x(t)] \quad \text{Formula 1}$$

$$E_y(t) = \vec{i} E_{0y}(t) \cos[\overline{k}z - \overline{w}t) + \epsilon_y(t)] \quad \text{Formula 2}$$

Here, Formulae 1 and 2 meet an equation of $\overline{E}(t) = \overline{E}_x(t) + \overline{E}_y(t)$. Accordingly, Stokes parameters can be expressed using Formulae 3 through 6 shown below.

$$S_0 = <E_{0x}^2> + <E_{0y}^2> \quad \text{Formula 3}$$

$$S_1 = <E_{0x}^2> + <E_{0y}^2> \quad \text{Formula 4}$$

$$S_2 = <2E_{0x}E_{0y}\cos(\epsilon)> \quad \text{Formula 5}$$

$$S_3 = <2E_{0x}E_{0y}\sin(\epsilon)> \quad \text{Formula 6}$$

A typical polarized state of incident polarized light can be expressed in a Stokes vector as Formula 7, from the Stokes parameters of Formulae 3 through 6.

$$\overline{S} = \begin{pmatrix} S_0 \\ S_1 \\ S_2 \\ S_3 \end{pmatrix} = \begin{pmatrix} I \\ Q \\ U \\ V \end{pmatrix} \quad \text{Formula 7}$$

Table 1 summarizes the polarized state of light expressed in a Stokes vector according to Formula 7.

TABLE 1

| Polarized state | Horizontal linear polarized light (H-state) | Vertical linear polarized light (V-state) | +45° linear polarized light (P-state +45) | −45° linear polarized light (P-state −45) | Right-hand circularly polarized light (R-state) | Left-hand circularly polarized light (L-state) |
|---|---|---|---|---|---|---|
| Stokes vector | $\begin{pmatrix}1\\1\\0\\0\end{pmatrix}$ | $\begin{pmatrix}1\\-1\\0\\0\end{pmatrix}$ | $\begin{pmatrix}1\\0\\1\\0\end{pmatrix}$ | $\begin{pmatrix}1\\0\\-1\\0\end{pmatrix}$ | $\begin{pmatrix}1\\0\\0\\1\end{pmatrix}$ | $\begin{pmatrix}1\\0\\0\\-1\end{pmatrix}$ |

That is, referring to Table 1, the polarized state of an inputted light can be expressed in Stokes vectors. Thus, in order to change the polarized state of an inputted light, the Stokes vector of a corresponding inputted light is changed into a Stokes vector corresponding to the polarized state of an outputted light.

The Stokes vector can be applied to a polarized light and to a partially polarized light. When the Stokes vector and a Muller matrix are used, the polarized state of an inputted light that is emitted according to the relationship between the optical axis angle θ and the phase delay value β can be expressed as Formulae 8 and 9.

$$M(\theta,\beta)=\begin{bmatrix}1 & 0 & 0 & 0\\ 0 & \sin^2 2\beta+\cos\theta\cos^2 2\beta & (1-\cos\theta)\sin 2\beta\cos 2\beta & -\cos 2\beta\sin\theta\\ 0 & (1-\cos\theta)\sin 2\beta\cos 2\beta & \cos^2 2\beta+\cos\theta\sin^2 2\beta & \sin 2\beta\sin\theta\\ 0 & \cos 2\beta\sin\theta & -\sin 2\beta\sin\theta & \cos\theta\end{bmatrix}$$

Formula 8

$$S_0 = M(\theta_3,\beta_3)M(\theta_2,\beta_2)M(\theta_1,\beta_1)S_i$$

Formula 9

That is, in order to obtain a changed polarized state $S_0$ of an outputted light from a polarized state $S_i$ of an inputted light, a desired polarized state $S_0$ of an outputted light can be obtained by substituting the optical axes of $\theta_1$, $\theta_2$, and $\theta_3$ and phase delay values of $\beta_1$, $\beta_2$, and $\beta_3$, respectively. The first, second, and third delay layers 241, 242, and 243 that constitute the multi-phase delay layer 24 may change wavelengths that are different from each other. For example, the first, second, and third delay layers 241, 242, and 243 respectively can change R wavelength, G wavelength, and B wavelength. Formula 9 is used when the multi-phase delay layer 24 includes the three first, second, and third delay layers 241, 242, and 243; however, the number of delay layers is not limited thereto. That is, the multi-phase delay layer 24 can include two delay layers, and in this case, Formula 10 is met.

$$S_0 = M(\theta_2,\beta_2)M(\theta_1,\beta_1)S_i$$

Formula 10

Figure 5A:
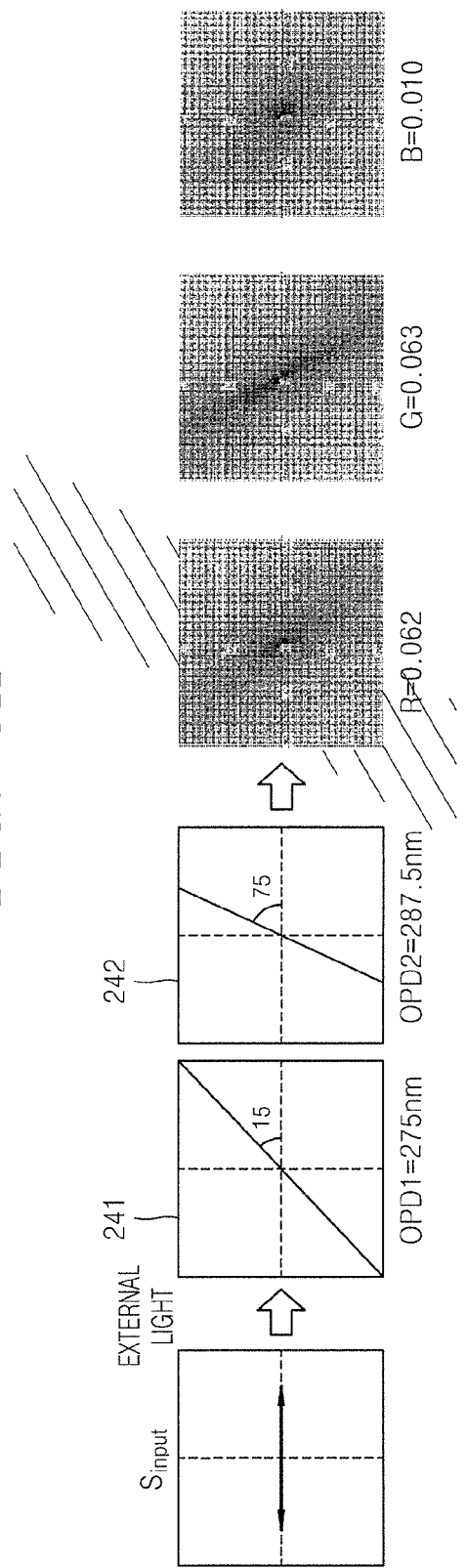
FIGS. 5A and 5B are ellipse diagrams of internal light and external light that have each passed a multi-phase delay layer.
Figure 5B:
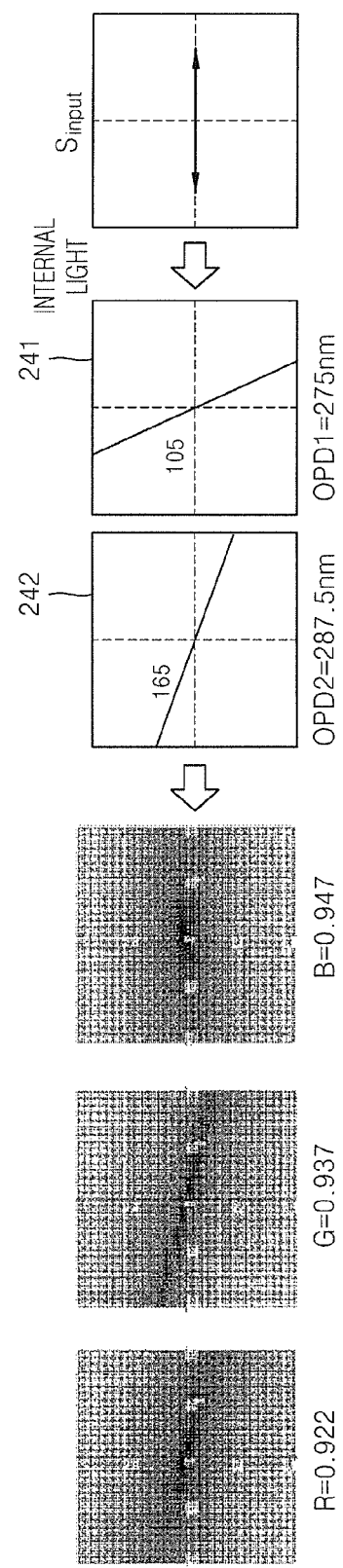

An application example of the multi-phase delay layer 24 will now be described in more detail with reference to FIGS. 5A and 5B. FIGS. 5A and 5B respectively show polarization examples of external light and internal light using the first and second delay layers 241 and 242 respectively having optical axes of $\theta_1=15°$ and $\theta_2=75°$ and optical path differences (OPD) of 275 mm and 287 mm. FIGS. 5A and 5B also show the change of ellipse diagrams of R, G, and B after applying the multi-phase delay layer 24. Here, the ellipse diagrams show values that indicate the degree of polarization, that is, when the value approaches 0, light is polarized close to a circle, and when the values approaches 1, light is linearly polarized.

Referring to FIGS. 1 and 5A together, an external light enters the multi-phase delay layer 24 as a linearly polarized light after passing through the linear polarization layer 25. Here, after passing through the multi-phase delay layer 24, the values of the ellipse diagrams of R, G, and B are respectively 0.062, 0.063, and 0.010, which are values close to a circularly polarized light. A large portion of the external light having a reduced polarization as described above cannot pass through the linear polarization layer 25 when the external light is reflected to the outside by re-passing through the linear polarization layer 25 after the external light is reflected by the second electrode layer 33. That is, when an external light enters, the linearity of the external light is changed into a shape close to a circle by passing through the multi-phase delay layer 24. In this way, the reflection of external light can be reduced.

Also, referring to FIG. 5B, in the case of an internal light, the values of the ellipse diagrams of R, G, and B after passing through the multi-phase delay layer 24 respectively are 0.922, 0.937, 0.947, which are close to 1, that is, close to a linear polarization. In this way, when the multi-phase delay layer 24 increases the polarity of an inputted polarized light to be close to a linearly polarized state, an amount of the internal light that can be emitted to the outside through the linear polarization layer 25 is increased. Thus, the change of the internal light to a linearly polarized light by the multi-phase delay layer 24 increases the internal light efficiency (internal light emission efficiency).

As described above with reference to FIGS. 5A and 5B, when the multi-phase delay layer 24 is used, the reflection of an external light can be reduced by changing the external light having a circularly polarized light with a low polarity, and an internal light efficiency can be increased by increasing the polarity of an internal light to be close to a linearly polarized light.

Figure 6:
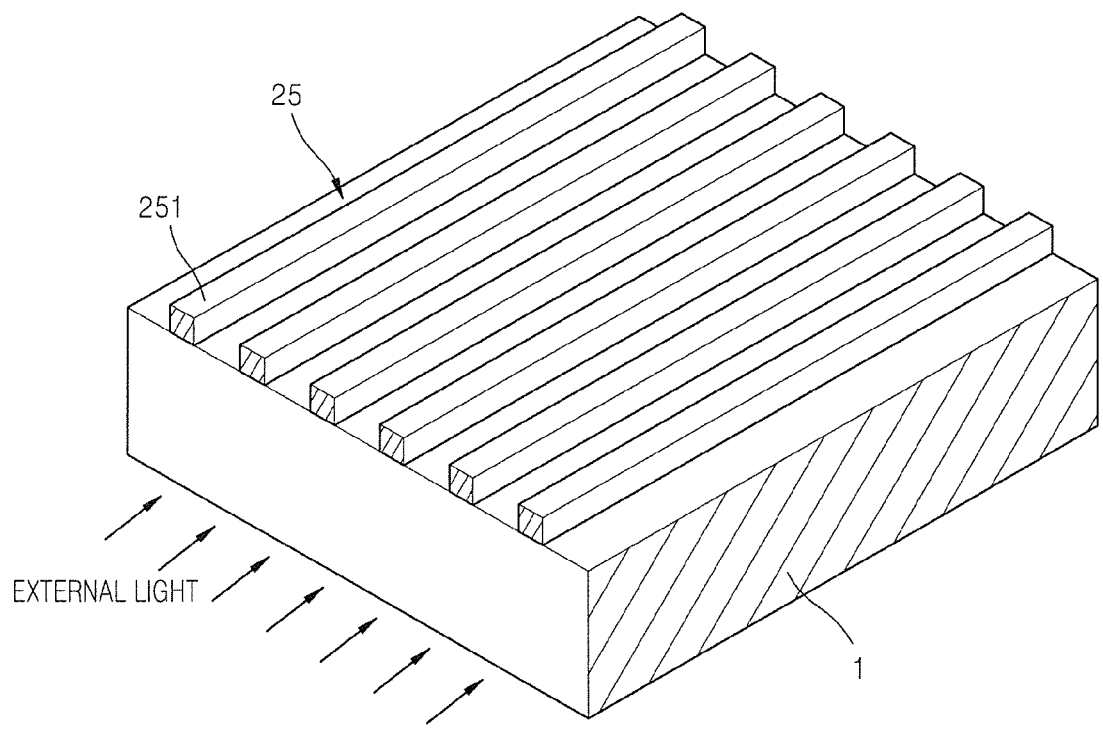
FIG. 6 is a perspective view of a linear polarization layer according to an embodiment of the present invention.

The linear polarization layer 25 will now be described in more detail. The linear polarization layer 25 and the phase delay layer 22 may be disposed by various suitable manufacturing methods. FIG. 6 is a perspective view of the linear polarization layer 25 according to an embodiment of the present invention.

The linear polarization layer 25 includes a plurality of wire grids 251 separated from each other by set or predetermined distances on a substrate. Each of the wire grids 251 may have a width of a few tens of nm and frequency of a few tens to hundreds of nm.

In the current invention, the wire grids 251 must have a low reflectance with respect to an inputted direction of an external light. This is because, as shown in FIG. 6, the external light reflection that occurs at the first surface, that is, the surface of the wire grid 251 that contacts the substrate 1 into which the external light first enters, cannot be blocked by the transmittance control layer 23 or the multi-phase delay layer 24.

Thus, the wire grids 251 shown in FIG. 6 can be formed by co-depositing graphite and a metal in order to reduce the reflectance of the wire grids 251 with respect to the input direction of the external light. Here, graphite may be conventional graphite, and may be graphite having a CN and/or CH structure into which nitrogen or hydrogen is partially substituted during a deposition process. The metal may be Al, Ag, W, and/or Au.

The wire grids 251 that can function as the linear polarization layer 25 must be able to be formed to have a nano pattern and must have a large k value that indicates absorption in electrical conductivity or optical constant. Graphite alone has a k value of 1/10 of that of a metal material such as Al, and, in order to compensate for the k value, a metal is further included. Graphite has a reflectance of approximately 10 to 20% of that of Al.

The mixing of a metal to graphite may be achieved using a co-deposition method described above, or a graphite film may be doped with a metal. However, in this case, the final content of a metal must be maintained at less than 5% so as not to reduce the reflectance by the metal. Here, the graphite film in which a metal is mixed may be patterned by using a dry etching process to which a PR process is applied, and at this time, a hard mask formed of $SiO_2$ and/or SiNx is used.

Figure 7:
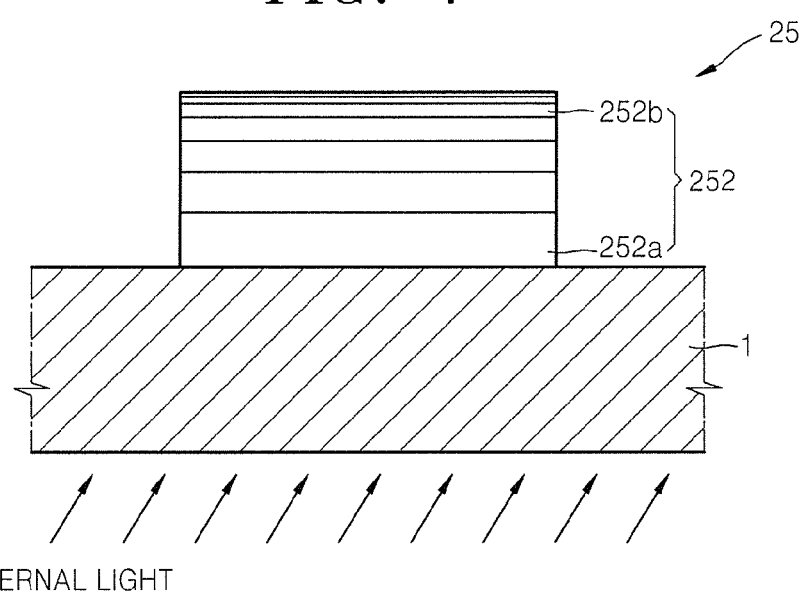
FIG. 7 is a cross-sectional view of a linear polarization layer according to another embodiment of the present invention.
Figure 8:
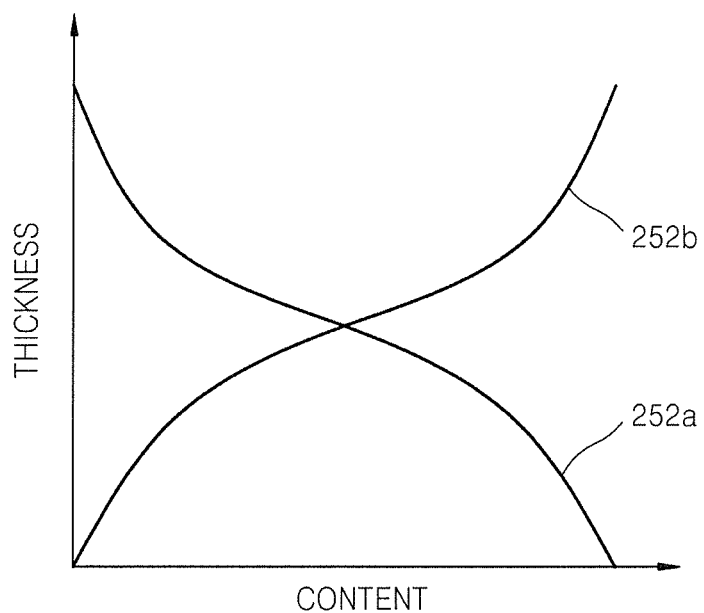
FIG. 8 is a graph showing the distribution of a first component and a second component of a wire grid.

FIG. 7 is a cross-sectional view of the linear polarization layer 25 according to another embodiment of the present invention. FIG. 8 is a graph showing the distribution of a first component 252a and a second component 252b of a wire grid 252. In the wire grid 252 of FIG. 8, the first component 252a, which is a transparent material, and a second component 252b, which is a metal, have concentration curves in a thickness direction of the wire grid 252. Here, the content of the first component 252a increases as it gets closer to the substrate 1, and the content of the second component 252b increases as it moves further away (i.e., in a direction away from) the substrate 1. That is, as shown in FIG. 8, the first component 252a and the second component 252b of the wire grid 252 may be sequentially formed on the substrate 1 to have concentration curves that are inverse proportional to each other. The content of the first component 252a in the wire grid 252 is reduced as it gets closer (moves in a direction) to the substrate, and the content of the second component 252b increases as it moves away (moves in a direction) away from the substrate. Accordingly, the content of the first component 252a is higher in a region close to the substrate 1, and the content of the second component 252b is higher in a region far from the substrate 1.

The first component 252a may be a transparent material, and may be selected from the group consisting of transparent insulating materials, such as $SiO_x(x \geq 1)$, $SiN_x(x \geq 1)$, $MgF_2$, $CaF_2$, $Al_2O_3$, and $SnO_2$, and the group consisting of transparent conductive materials, such as indium tin oxide (ITO), indium zinc oxide (IZO), ZnO, and $In_2O_3$. The second component 252b may be at least one material selected from the group consisting of Fe, Co, V, Ti, Al, Ag, Si, Cr, Mo, Ge, Y, Zn, Zr, W, Ta, Cu, and Pt. In the wire grid 252 formed of a mixture of a metal having a concentration curve and a transparent material, the transparent material gradually transforms into an opaque metal as the thickness of the wire grid 252 gradually is increased. Therefore, interfacial reflection is reduced due to the difference of refractive index, and light inputted to the wire grid 252 is absorbed in the wire grid 252.

Here, the linear polarization layer 25, the multi-phase delay layer 24, the phase delay layer 22, and the CLC layer 21 can be formed on the substrate 1 without the need of forming adhesive layers therebetween, thereby reducing the thickness of an organic light emitting display device and further increasing the brightness of the organic light emitting device.

Figure 9:
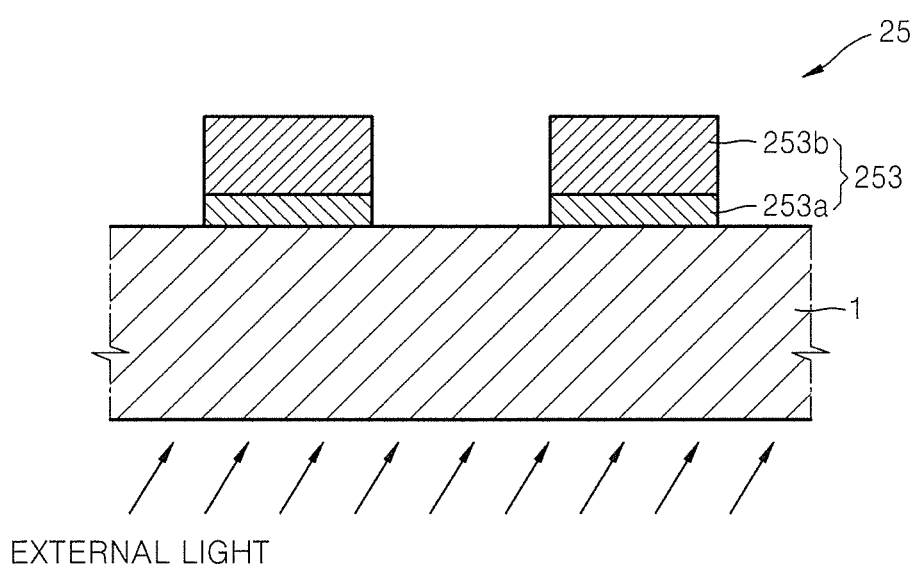
FIG. 9 is a cross-sectional view of a linear polarization layer according to another embodiment of the present invention.

FIG. 9 is a cross-sectional view of the linear polarization layer 25 according to another embodiment of the present invention. Referring to FIG. 9, a metal layer 253b is formed on a low reflection layer 253a close to the incident direction of an external light after forming the low reflection layer 253a on regions of the substrate 1. In this configuration, the reflection of an external light on a surface of the wire grid 253, that is, on a surface of the wire grid 253 adjacent to the substrate 1 can be reduced. The low reflection layer 253a can be formed of CdSe, CdTe, and/or ruthenium.

Figure 10:
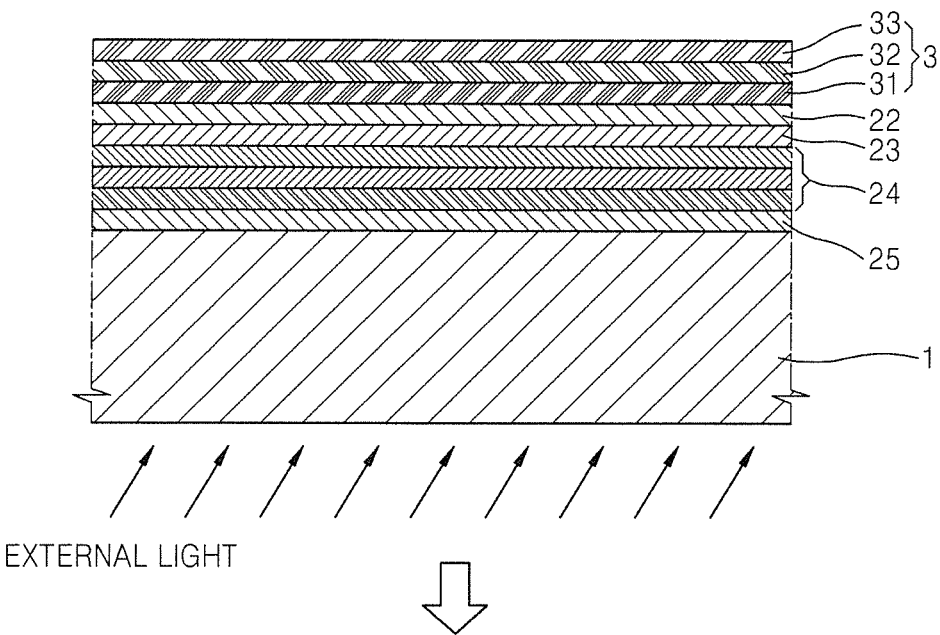
FIG. 10 is a cross-sectional view of the organic light emitting device of FIG. 1 excluding a cholesteric liquid crystal (CLC) layer.
Figure 11:
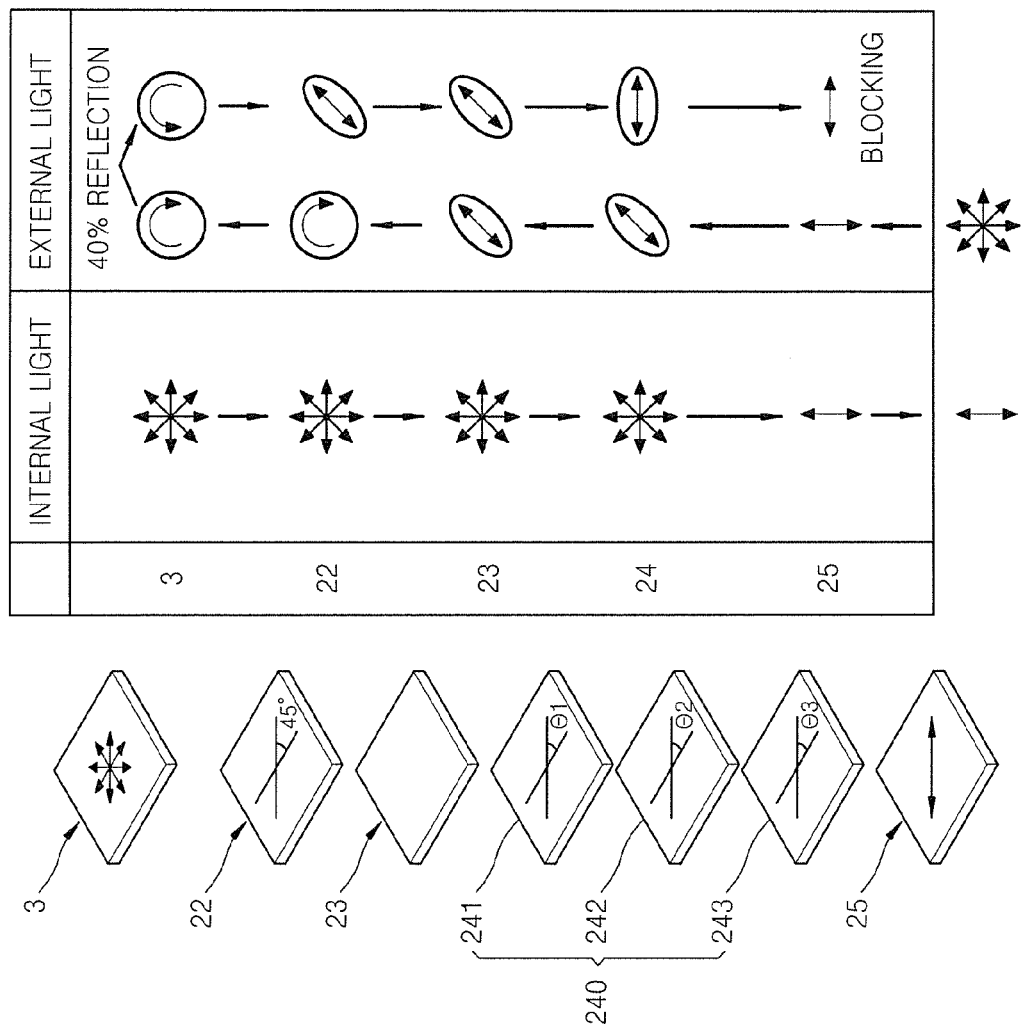
FIG. 11 is a conceptual drawing showing the polarization states of internal light and external light of FIG. 10.

FIG. 10 is a cross-sectional view of the organic light emitting display device of FIG. 1 in which the CLC layer 21 is omitted. FIG. 11 is a conceptual drawing showing the polarization states of internal light and external light of FIG. 10. Referring to FIG. 11, the internal light is emitted to the linear polarization layer 25 as a sum of random polarized lights since there is no selective reflection by the CLC layer 21, and is emitted as a linearly polarized light having a vector in a direction by passing through the linear polarization layer 25. In the case of an external light, the external light having a vector in a direction enters through the linear polarization layer 25 and the polarity of the external light is reduced by passing through the multi-phase delay layer 24. Afterwards, wavelengths of the external light, except for the R, G, and B wavelengths, are absorbed in the transmittance control layer 23. The external light becomes a linearly polarized light which is perpendicular to the entering axis by passing twice through the phase delay layer 22, and is eventually blocked by the phase delay layer 22, thereby reducing the reflection of external light. In this way, even when the CLC layer 21 is omitted, the reflection of external light can still be reduced.

According to embodiments of the present invention, the linear polarization layer 25, the multi-phase delay layer 24, the transmittance control layer 23, the phase delay layer 22, and the CLC layer 21 can be formed using a suitable manufacturing process such as a deposition method. Accordingly, the increase in the thickness of the organic light emitting display device can be avoided by using no additional polarized films to attach the layers to each other.

The linear polarization layer 25, the multi-phase delay layer 24, the transmittance control layer 23, the phase delay layer 22, and the CLC layer 21 may be disposed in various suitable ways besides the methods described above. Also, the linear polarization layers 25 of FIGS. 1, 6, 7, and 9 are based on an emissive bottom type organic light emitting display device; however, a modification of the linear polarization layer 25 can also be applied to a top emission type organic light emitting display device in consideration of the incident direction of external light.

Figure 12:
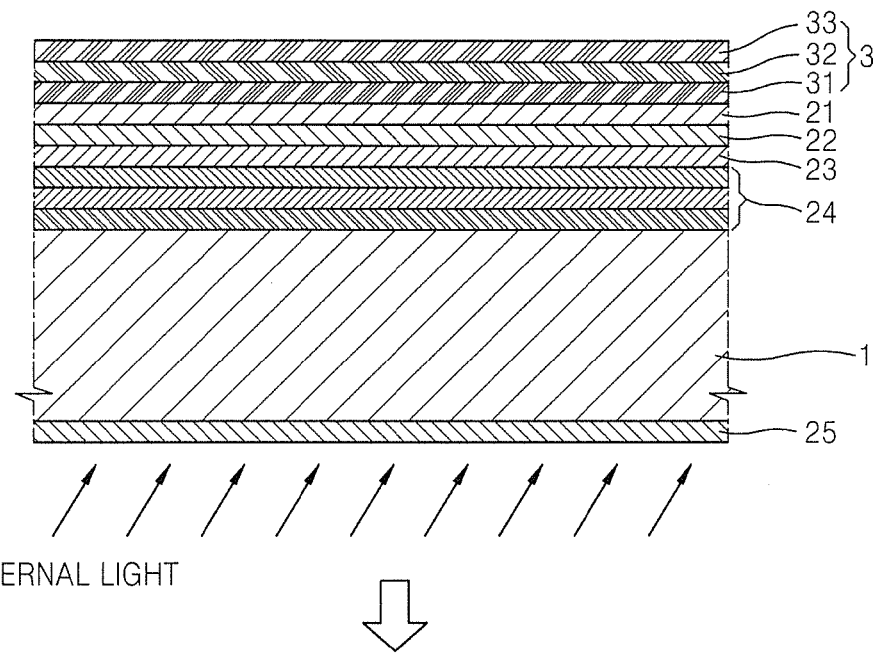
FIGS. 12 through 20 are cross-sectional views of first through nine modifications of the organic light emitting display device of FIG. 1, according to embodiments of the present invention.

FIG. 12 is a cross-sectional view of a first modification of the organic light emitting display device of FIG. 1. The linear polarization layer 25 is disposed on an outer surface of the substrate 1, and the multi-phase delay layer 24, the transmittance control layer 23, the phase delay layer 22, and the CLC layer 21 are sequentially disposed on the other surface of the substrate 1. The organic light emitting device 3 is formed on the CLC layer 21. Each of the components has been described above, and thus their description will not be repeated.

Figure 13:
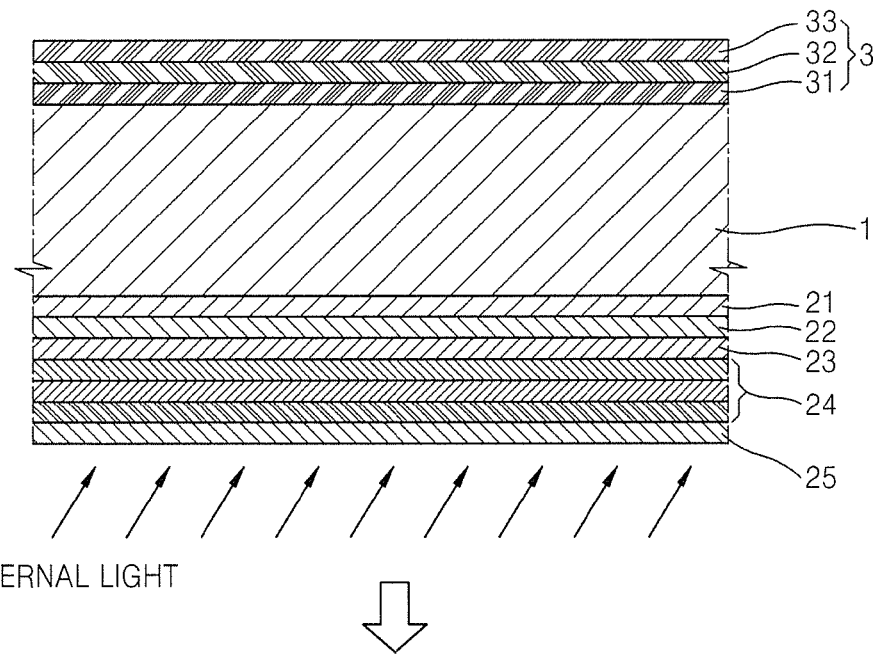

FIG. 13 is a cross-sectional view of a second modification of the organic light emitting display device of FIG. 1, according to another embodiment of the present invention. The CLC layer 21, the phase delay layer 22, the transmittance control layer 23, the multi-phase delay layer 24, and the linear polarization layer 25 are sequentially disposed in the order stated on a surface of the substrate 1 facing the outside, and the organic light emitting device 3 is formed on the other surface of the substrate 1. Each of the components has been described above, and thus their description will not be repeated.

The organic light emitting display device described above is a bottom emission type in which an image is formed in a direction towards the substrate 1; however, the present invention is not limited thereto, and thus, embodiments of the present invention can also be applied to a top emission type in which an image emitted from the light emitting layer 32 is realized not in a direction of the substrate 1 but in a direction opposite to (i.e., moving away from) the substrate 1.

Figure 14:
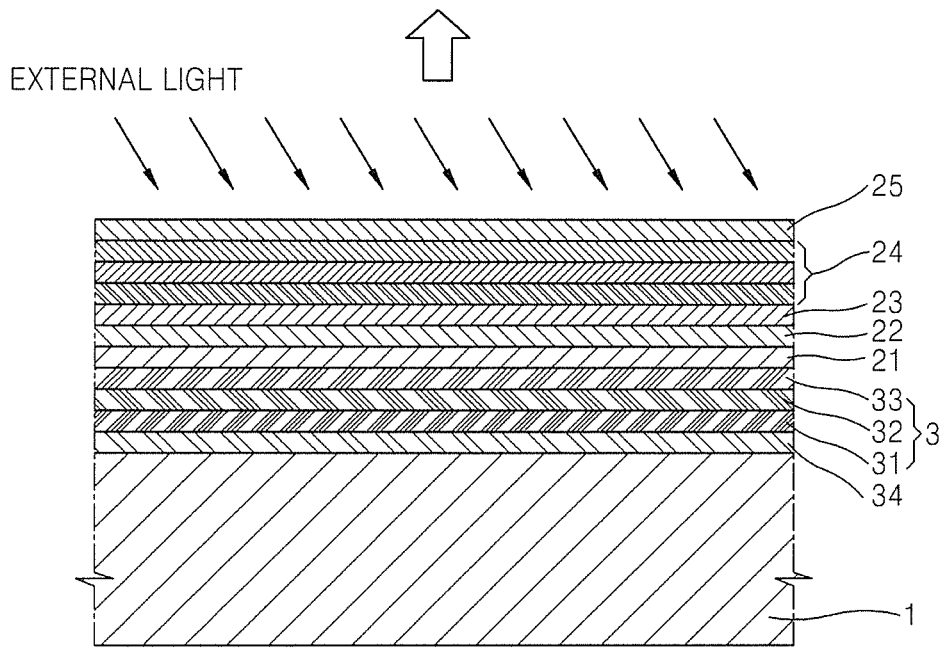

FIG. 14 is a cross-sectional view of a third modification of the organic light emitting display device of FIG. 1, according to another embodiment of the present invention. Referring to FIG. 14, a reflection film 34 is formed on the substrate 1, and the organic light emitting device 3 is formed on the reflection film 34. In one embodiment, a sealing member that seals the organic light emitting device 3 is formed on the organic light emitting device 3.

The substrate 1 may be a transparent glass substrate as in the embodiments described above, but not necessarily transparent. Also, the substrate 1 may be formed of a plastic material and/or a metal, besides glass. When a metal is used to form the substrate 1, an insulating film is formed on a surface of the metal.

The reflection film 34 formed on a surface of the substrate 1 may be formed of Ag, Mg, Al, Pt, Pd, Au, Ni, Nd, Ir, Cr or a compound of these metals. The first electrode layer 31 may be formed on the reflection film 34 using a material having a high work function, such as ITO, IZO, ZnO, or $In_2O_3$. Here, the first electrode layer 31 functions as an anode electrode. If the first electrode layer 31 functions as a cathode electrode, the first electrode layer 31 may be formed of Ag, Mg, Al, Pt, Pd, Au, Ni, Nd, Ir, Cr or a compound of these metals to function as a reflection film. Hereinafter, a case when the first electrode layer 31 functions as an anode electrode will now be described in more detail.

The second electrode layer 33 may be a transparent electrode, and may be formed to be thin so as to be a semi-transparent film using a metal having a low work function, such as Li, Ca, LiF/Ca, LiF/Al, Al, Mg, or Ag. Of course, the high resistance problem due to thin thickness of the second electrode layer 33 can be compensated for by forming a transparent conductive film on the metal semi-transparent film using ITO, IZO, ZnO, or $In_2O_3$. The light emitting layer 32 interposed between the first electrode layer 31 and the second electrode layer 33 is the same as the light emitting layer described above. In the current embodiment, the CLC layer 21, the phase delay layer 22, the transmittance control layer 23, the multi-phase delay layer 24, and the linear polarization layer 25 are sequentially disposed (e.g., in the stated order) on the second electrode layer 33. Thus, an external light entering from a direction in which an image is realized is reflected by each of the layers of the organic light emitting device 3 or on a surface of the reflection film 34.

Figure 15:
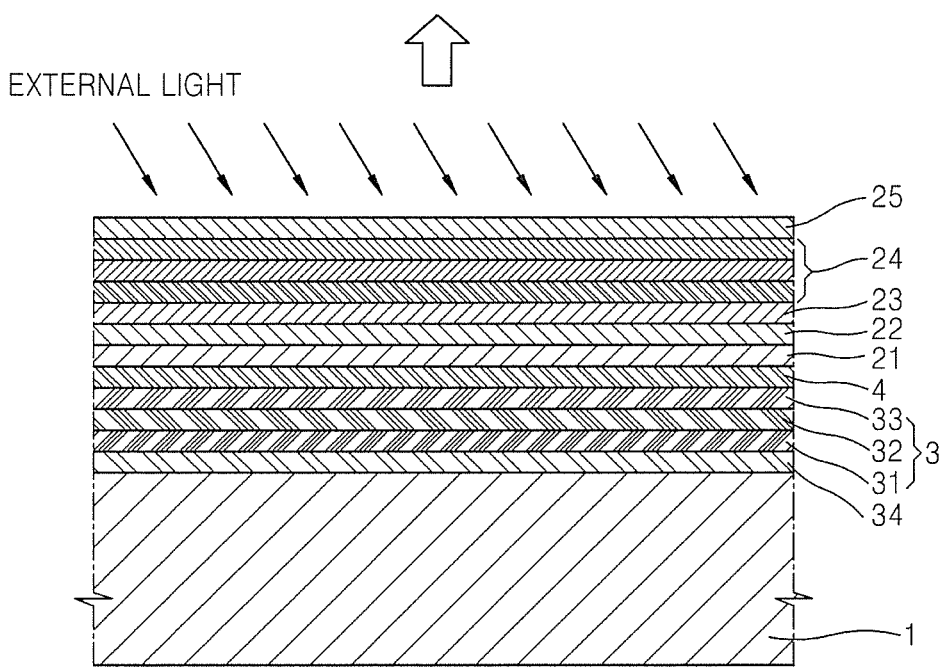

FIG. 15 is a cross-sectional view of a fourth modification of the organic light emitting display device of FIG. 1, according to another embodiment of the present invention. Referring to FIG. 15, a passivation layer 4 is formed to prevent or protect the second electrode layer 33 from being damaged, and may be formed of a transparent inorganic material and/or an organic material.

The inorganic material may be metal oxide, metal nitride, metal carbide, metal oxynitride or a compound of these materials. The metal oxide may be silicon oxide, aluminum oxide, titanium oxide, indium oxide, tin oxide, indium tin oxide, or a compound of these materials. The metal nitride may be aluminum nitride, silicon nitride, or a compound of these materials. The metal carbide may be silicon carbide, and the metal oxynitride may be silicon oxynitride. Inorganic material may be silicon, or ceramic derivatives of silicon and metal respectively, and also, may be diamond-like carbon (DLC).

The organic material may be an organic polymer, an inorganic polymer, an organometallic polymer, or a hybrid organic/inorganic polymer, and in particular, may be acryl resin.

Figure 16:
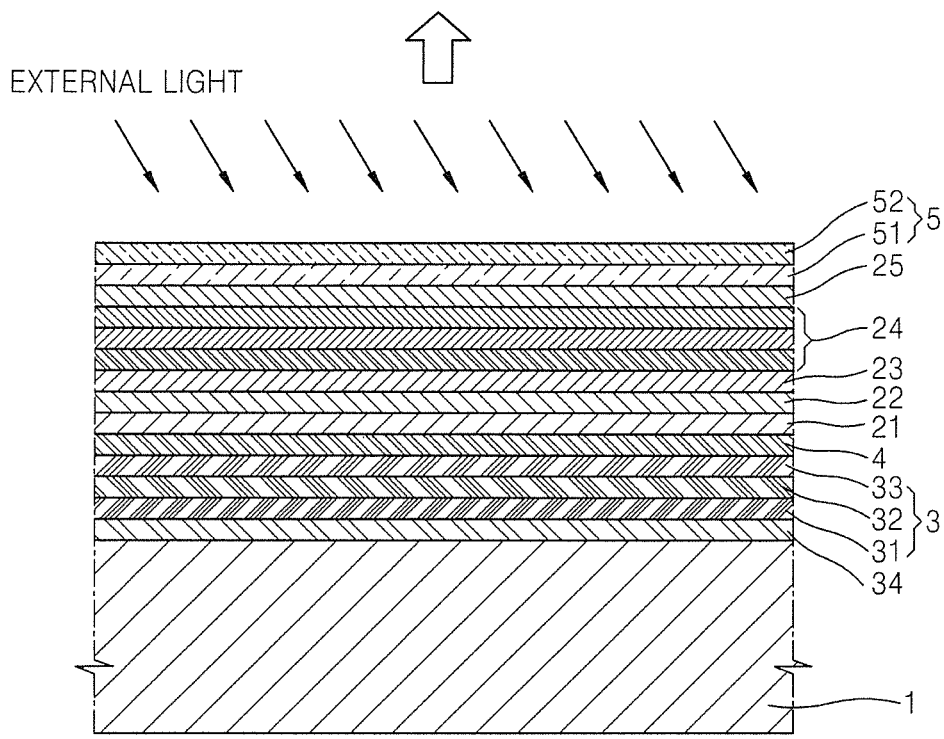

The location of the passivation layer 4 is not limited thereto, and may be interposed between the layers. FIG. 16 is a cross-sectional view of a fifth modification of the organic light emitting display device of FIG. 1, according to another embodiment of the present invention. The organic light emitting display device of FIG. 16 is another example of a top emission type organic light emitting display device according to another embodiment of the present invention. A thin film type sealing member 5 is further formed on the linear polarization layer 25 of FIG. 15. The thin film type sealing member 5 protects the organic light emitting device 3 from penetrating external moisture and/or oxygen. The thin film type sealing member 5 may include an inorganic material layer 51 and/or an organic material layer 52, and may be formed by alternately stacking the inorganic material layer 51 and the organic material layer 52. The remaining structure of the organic light emitting display device is the same as the structure of the embodiment of FIG. 3, and thus the description thereof will not be repeated.

The inorganic material layer 51 may be formed of metal oxide, metal nitride, metal carbide, metal oxynitride, or a compound of these materials. The metal oxide may be silicon oxide, aluminum oxide, titanium oxide, indium oxide, tin oxide, indium tin oxide, or a compound of these materials. The metal nitride may be aluminum nitride, silicon nitride, or a compound of these materials. The metal carbide may be silicon carbide, and the metal oxynitride may be silicon oxynitride. Inorganic material may be silicon, or ceramic derivatives of silicon and metal respectively, and also, may be DLC.

The inorganic material layer 51 may be formed by a deposition method. When the inorganic material layer 51 is deposited, pores included in the inorganic material layer 51 may grow in size. Therefore, in order to prevent the pores from growing in size on the same location, the organic material layer 52 is additionally included besides the inorganic material layer 51. The organic material layer 52 may be formed of organic polymer, an inorganic polymer, an organometallic polymer, or a hybrid organic/inorganic polymer, and in particular, may be formed of acryl resin.

Figure 17:
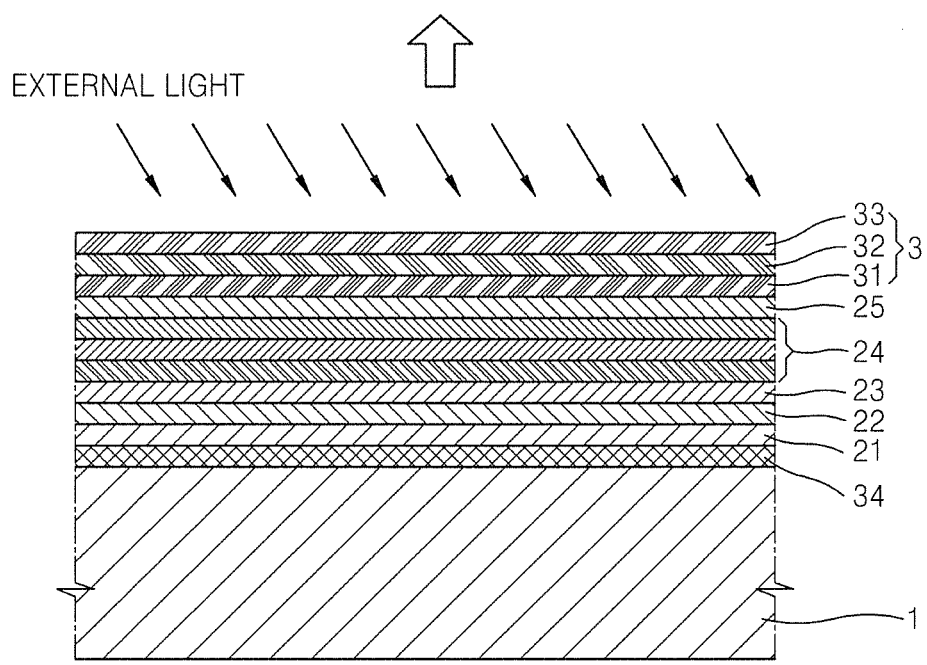

FIG. 17 is a cross-sectional view of a sixth modification of the organic light emitting display device of FIG. 1, according to another embodiment of the present invention. The organic light emitting display device of FIG. 17 is another example of a top emission type organic light emitting display device according to another embodiment of the present invention. The CLC layer 21, the phase delay layer 22, the transmittance control layer 23, the multi-phase delay layer 24, and the linear polarization layer 25 may be interposed between the reflection film 34 and the organic light emitting device 3.

Figure 18:
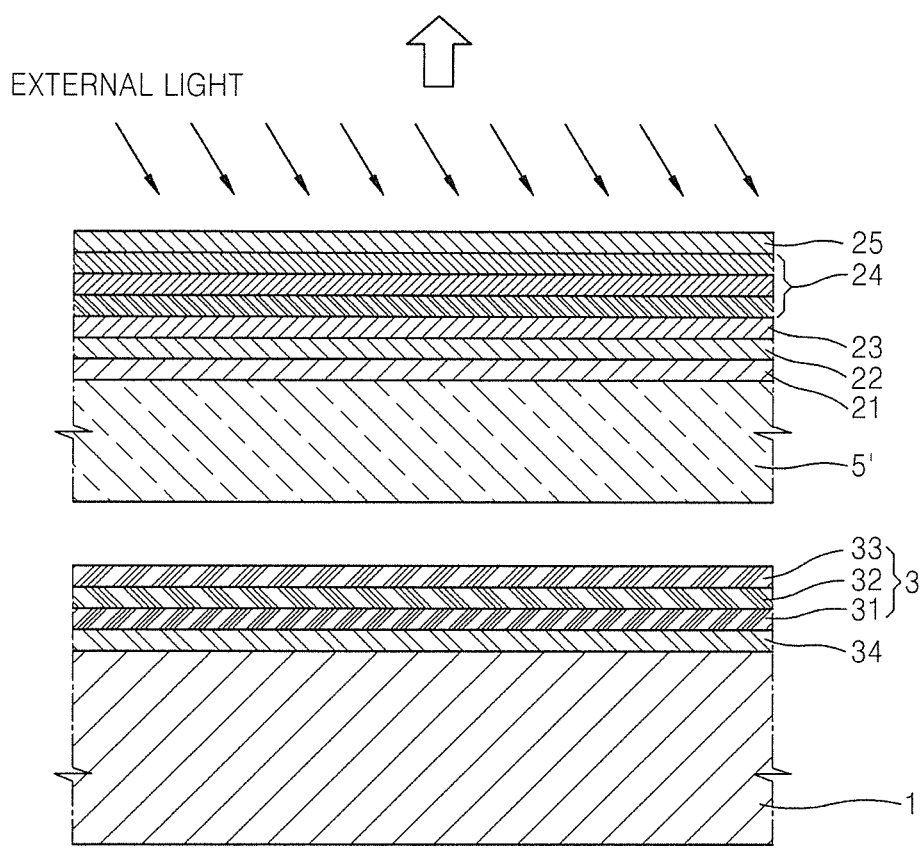

FIG. 18 is a cross-sectional view of a seventh modification of the organic light emitting display device of FIG. 1, according to another embodiment of the present invention. In FIG.

18, a transparent substrate is used as a sealing member 5'. The transparent substrate may be a glass substrate, but is not limited thereto, and may also be a plastic substrate.

Figure 19:
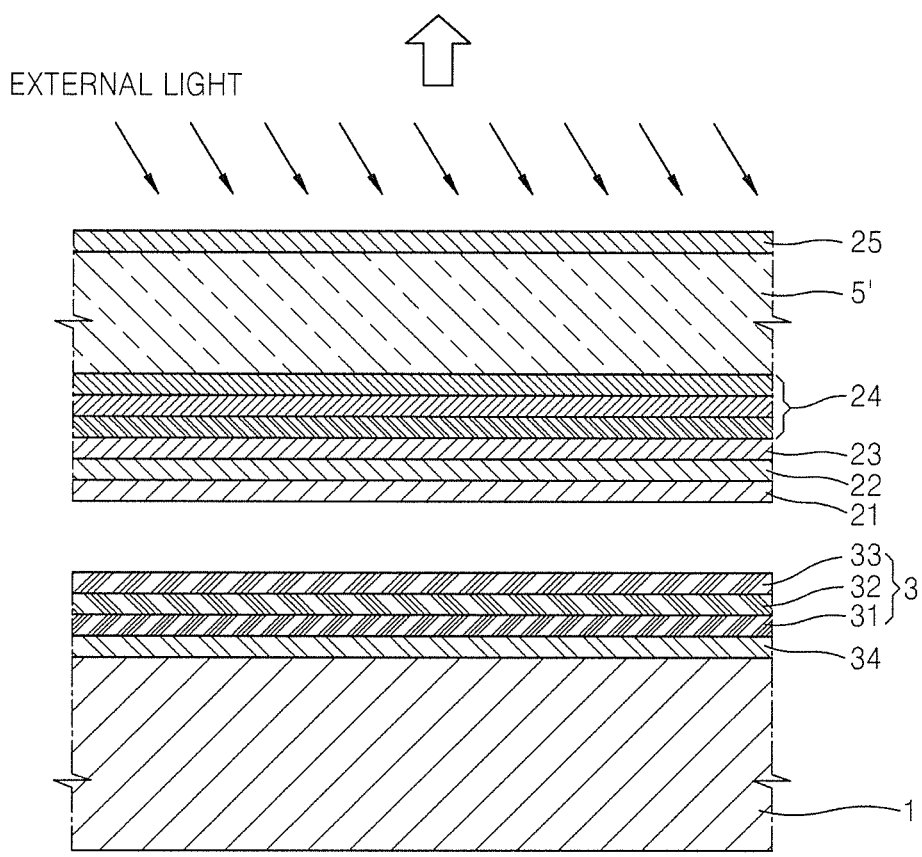

FIG. 19 is a cross-sectional view of an eighth modification of the organic light emitting display device of FIG. 1, according to another embodiment of the present invention. Referring to FIG. 19, the multi-phase delay layer 24, the transmittance control layer 23, the phase delay layer 22, and the CLC layer 21 are disposed on a surface of the transparent substrate, which is the sealing member 5', facing the organic light emitting device 3, and the linear polarization layer 25 are sequentially disposed on the other surface of the sealing member 5'.

Figure 20:
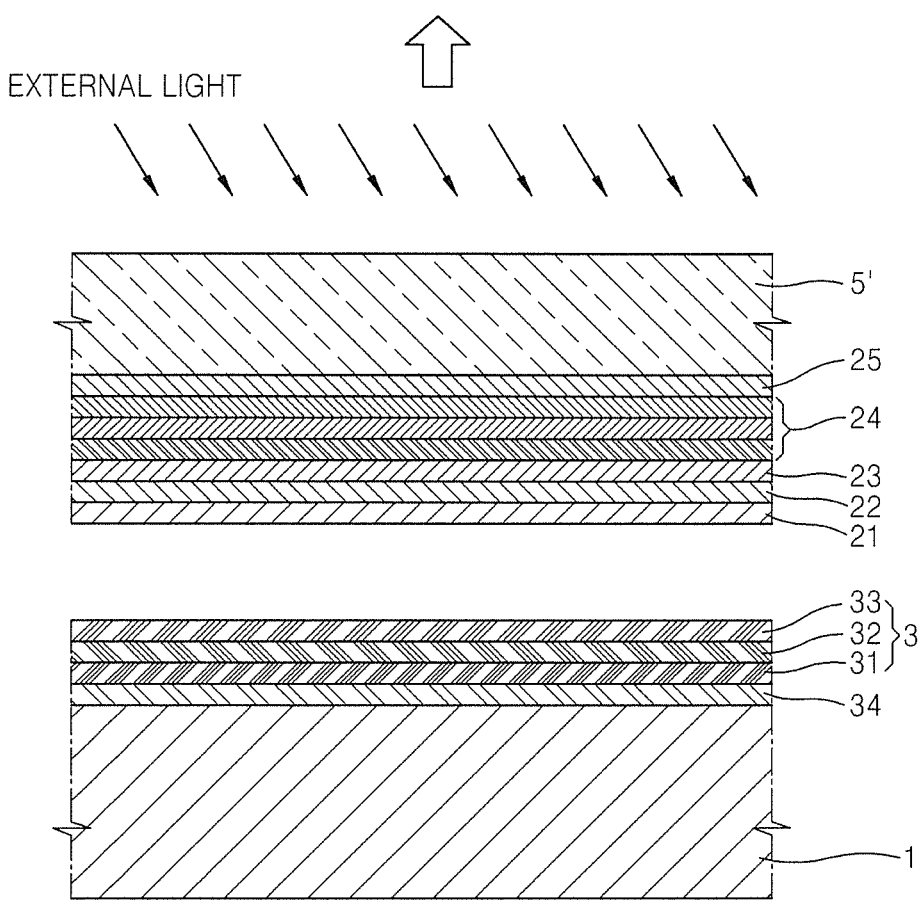

FIG. 20 is a cross-sectional view of a ninth modification of the organic light emitting display device of FIG. 1. Referring to FIG. 20, the linear polarization layer 25, the multi-phase delay layer 24, the transmittance control layer 23, the phase delay layer 22, and the CLC layer 21 are sequentially disposed in the stated order on a surface of the transparent substrate, which is the sealing member 5', facing the organic light emitting device 3.

In the organic light emitting display devices of FIGS. 18 through 20 according to other embodiments of then present invention, an inert gas may be filled between the sealing member 5' and the organic light emitting device 3, and an inorganic material or an organic material may further be formed to further increase the sealing characteristics of the organic light emitting device 3.

Figure 21:
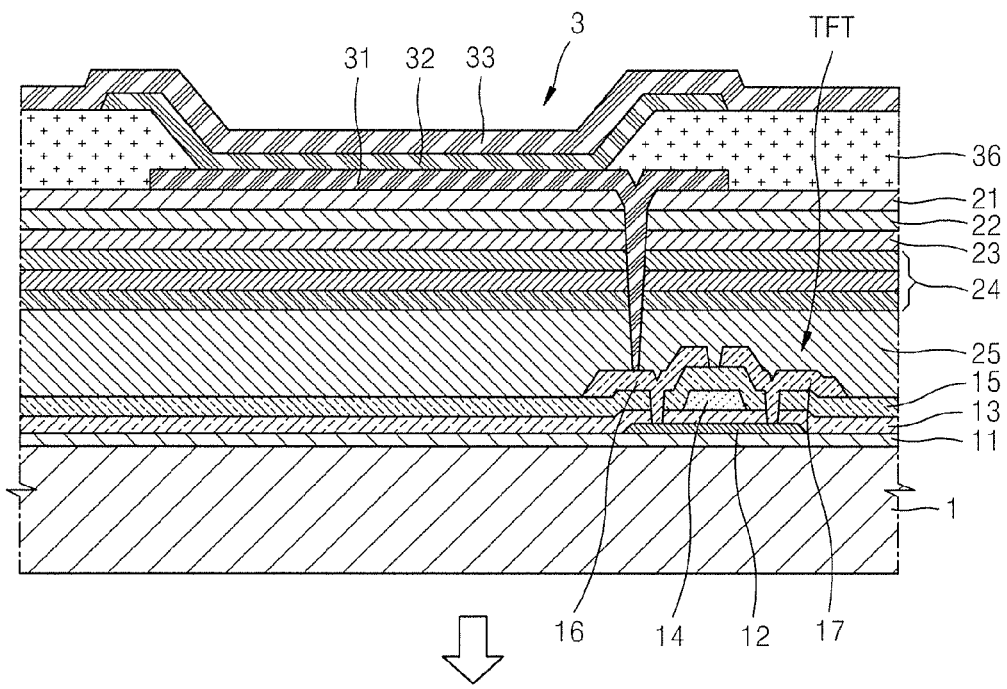
FIG. 21 is a cross-sectional view of an active matrix and bottom emission type organic light emitting display device according to another embodiment of the present invention.

FIG. 21 is a cross-sectional view of a bottom emission AM type organic light emitting display device according to another embodiment of the present invention. Referring to FIG. 21, a thin film transistor (TFT) is formed on an upper surface of the substrate 1. At least one TFT is formed in each pixel, and is electrically connected to the organic light emitting device 3.

More specifically, a buffer layer 11 is formed on the substrate 1, and a semiconductor active layer 12 having a set or predetermined pattern is formed partially on the buffer layer 11. A gate insulating film 13 is formed on the semiconductor active layer 12 using $SiO_2$ and/or $SiN_x$, and a gate electrode 14 is formed on a set or predetermined region of the gate insulating film 13. The gate electrode 14 is connected to a gate line via which an ON/OFF signal for TFT is applied. An interlayer insulating layer 15 is formed on the gate electrode 14, and source and drain electrodes 16 and 17 are respectively connected to source and drain regions of the semiconductor active layer 12 through contact holes.

The TFT having the structure described above is protected by covering the TFT with a passivation layer. In the case of the organic light emitting display device of FIG. 21, the passivation layer is formed by sequentially stacking the linear polarization layer 25, the multi-phase delay layer 24, the transmittance control layer 23, the phase delay layer 22, and the CLC layer 21.

A first electrode layer 31, which is an anode electrode, is partially formed on the CLC layer 21, and a pixel define layer 36 is formed using an insulating material to cover the first electrode layer 31. After forming a set or predetermined opening in the pixel define layer 36, a light emitting layer 32 is formed in a region defined by the opening. Afterwards, a second electrode layer 33 is formed to cover the entire pixel.

In the AM type organic light emitting display device as described above, since the linear polarization layer 25, the multi-phase delay layer 24, the transmittance control layer 23, the phase delay layer 22, and the CLC layer 21 are sequentially stacked on the TFT, in FIG. 21, the reflection of an external light entering from a lower direction of the substrate 1 can be blocked or reduced by the linear polarization layer 25 and the phase delay layer 22.

Figure 22:
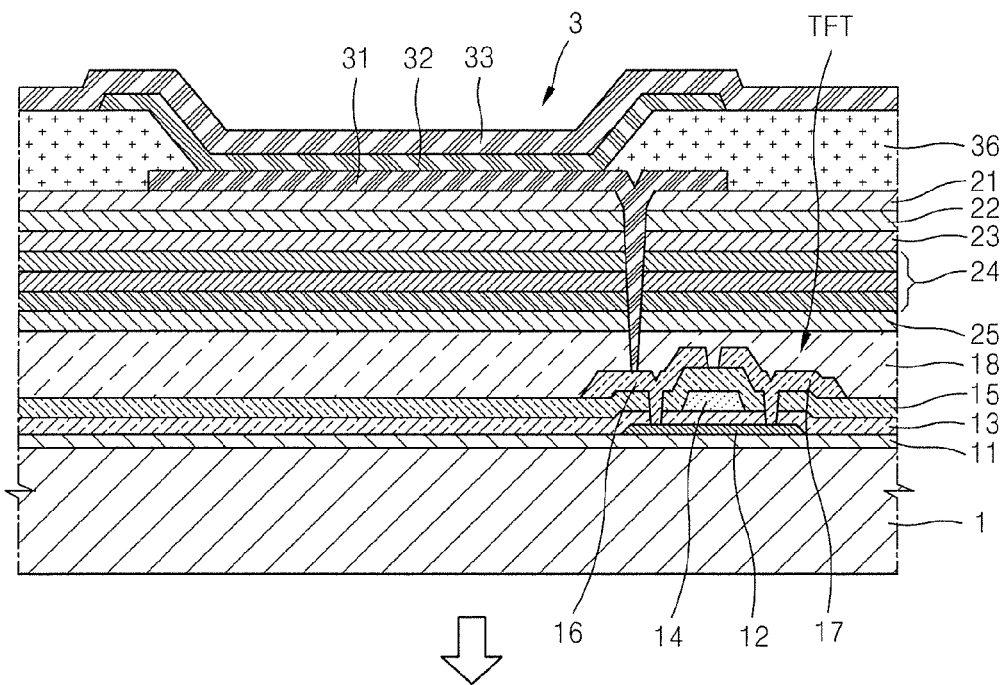
FIG. 22 is a cross-sectional view of a first modification example of FIG. 22.

As shown in FIG. 22, according to another embodiment of the present invention an additional passivation layer 18 may be formed on the TFT using an organic material and/or an inorganic material, and the linear polarization layer 25, the multi-phase delay layer 24, the transmittance control layer 23, the phase delay layer 22, and the CLC layer 21 may be sequentially formed on the passivation layer 18.

Figure 23:
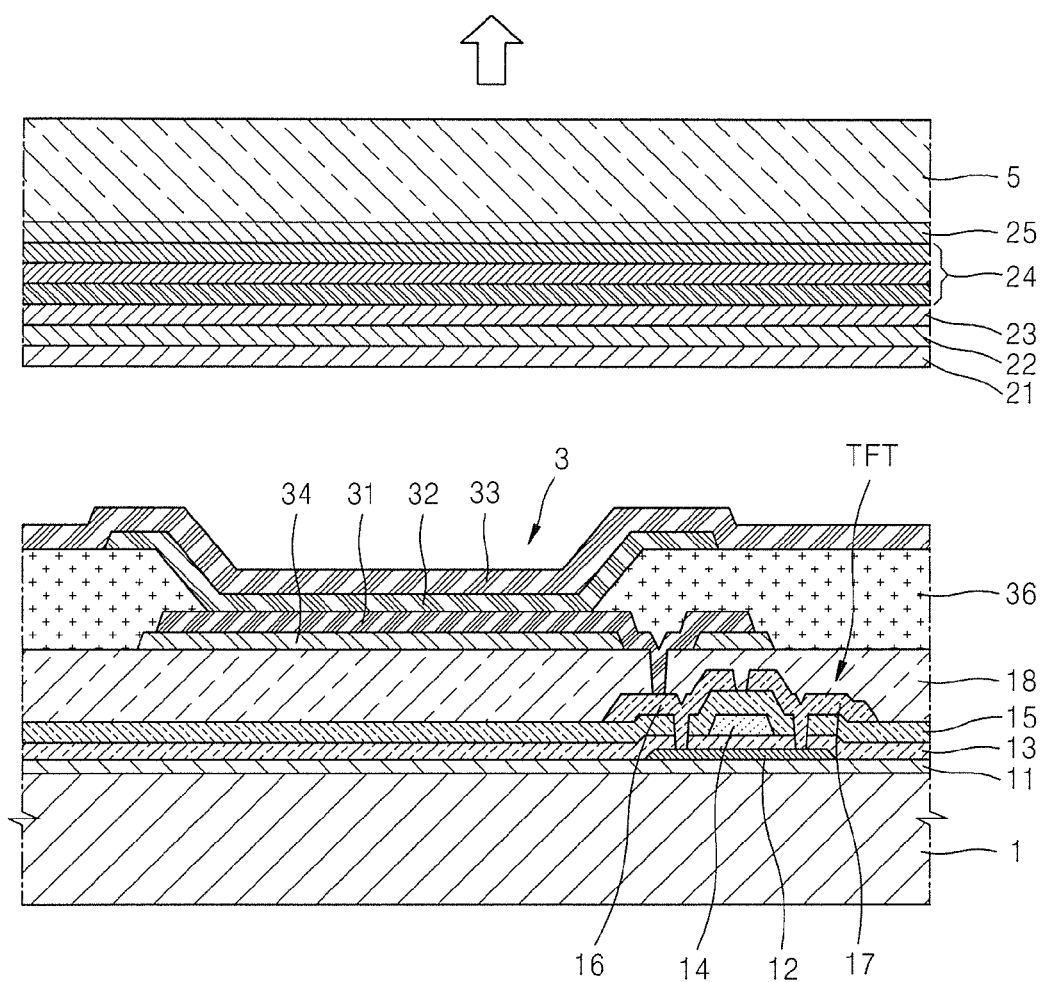
FIG. 23 is a cross-sectional view of an active matrix and top emission type organic light emitting display device according to another embodiment of the present invention.

FIG. 23 is a cross-sectional view of a top emission AM type organic light emitting display device according to an embodiment of the present invention. Referring to FIG. 23, a TFT is formed on an upper surface of the substrate 1. At least one TFT is formed in each pixel, and is electrically connected to the organic light emitting device 3. In FIG. 23, a passivation layer 18 is formed to cover the TFT, and a reflection film 34 is formed on the passivation layer 18. A first electrode layer 31, which is an anode electrode, is formed partially on the reflection film 34, and a pixel define layer 36 is formed on the first electrode layer 31 to cover the first electrode layer 31. After a set or predetermined opening is formed in the pixel define layer 36, a light emitting layer 32 is formed in a region defined by the opening. Afterwards, a second electrode layer 33 is formed to cover the entire pixels.

In the top emission AM type organic light emitting display device of FIG. 23, as in the organic light emitting display device of FIG. 20, a linear polarization layer 25, a multi-phase delay layer 24, a transmittance control layer 23, a phase delay layer 22, and a CLC layer 21 are sequentially disposed in the stated order on a surface of the substrate 1, which is a sealing member 5', facing the organic light emitting device 3. The top emission AM type organic light emitting display device according to the present invention is not limited to the organic light emitting display devices described above, and may be applied to any flat panel display devices that use an inorganic light emitting device, a liquid crystal display (LCD), or an electron emission device as a light emitting device.

The organic light emitting display device according to an embodiment of the present invention can increase visibility, brightness, and power consumption efficiency by reducing the reflection of external light and by increasing the efficiency of internal light (efficiency of the internal light emission).

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device comprising:
   a substrate;
   a sealing member;
   an organic light emitting device between the substrate and the sealing member and configured to display an image;
   a phase delay layer disposed with the substrate, the organic light emitting device, and the sealing member;
   a linear polarization layer disposed with the substrate, the organic light emitting device, the sealing member, and the phase delay layer and to be in a location closer to a display surface of the organic light emitting display where the image is displayed than the organic light emitting device, the sealing member, and the phase delay layer are from the display surface;
   a multi-phase delay layer between the phase delay layer and the linear polarization layer; and a transmittance control layer disposed with the substrate, the organic light emitting device, the sealing member, the phase delay layer, the multi-phase delay layer, and the linear polarization layer.

2. The organic light emitting display device of claim 1, further comprising a cholesteric liquid crystal (CLC) layer disposed with the substrate, the organic light emitting device, the sealing member, and the phase delay layer and to be in a location further away from the display surface than the phase delay layer is from the display surface.

3. The organic light emitting display device of claim 2, wherein the CLC layer is configured to transmit polarized light having a first rotation direction among inputted oval and/or circularly polarized light and to reflect polarized light having a second rotation direction.

4. The organic light emitting display device of claim 1, wherein the transmittance control layer is configured to absorb incident light having visible wavelengths other than red (R), green (G), and blue (B) wavelengths.

5. The organic light emitting display device of claim 1, wherein the transmittance control layer comprises a material selected from the group consisting of polycarbonate (PC), Polymethyl Methacrylate (PMMA), polyethylene terephthalate (PET), polyethersulfone (PES), and triacetate cellulose.

6. The organic light emitting display device of claim 1, wherein the transmittance control layer comprises a material selected from the group consisting of azo group materials, azomethine group materials, diimmonium group materials, phthalocyanine group materials, anthraquinone group materials, indigo group materials, thioindigo group materials, dioxadine group materials, quinacridone group materials, isoindolinone group materials, metal oxide group materials, and metal complex compound materials.

7. The organic light emitting display device of claim 1, wherein the multi-phase delay layer comprises a plurality of delay layers respectively having differing optical axis angles.

8. The organic light emitting display device of claim 1, wherein the multi-phase delay layer is configured to increase the polarity of incident light entering from its first side and to reduce the polarity of incident light entering from its second side.

9. The organic light emitting display device of claim 1, wherein the phase delay layer is configured to delay an incident light with a delay value of $\lambda/4$.

10. The organic light emitting display device of claim 1, wherein the organic light emitting display device is configured to realize the image in a direction to the substrate.

11. The organic light emitting display device of claim 10, wherein the linear polarization layer is on the substrate, the multi-phase delay layer is on the linear polarization layer, the phase delay layer is on the linear polarization layer, and the organic light emitting device is on the phase delay layer.

12. The organic light emitting display device of claim 10, wherein the linear polarization layer is on a first surface of the substrate, the multi-phase delay layer is on a second surface of the substrate opposite to the first surface on which the linear polarization layer is on, the phase delay layer is on the multi-phase delay layer, and the organic light emitting device is on the phase delay layer.

13. The organic light emitting display device of claim 10, wherein the organic light emitting device is on a first surface of the substrate and the linear polarization layer, the multi-phase delay layer, and the phase delay layer are sequentially disposed on a second surface of the substrate opposite to the first surface on which the organic light emitting device is on.

14. The organic light emitting display device of claim 1, wherein the organic light emitting display device is configured to realize the image in a direction to the sealing member.

15. The organic light emitting display device of claim 14, further comprising a passivation layer disposed with the phase delay layer, the multi-phase delay layer, and the linear polarization layer, the phase delay layer, the multi-phase delay layer, and the linear polarization layer being sequentially disposed on the organic light emitting device.

16. The organic light emitting display device of claim 14, further comprising a reflection film between the substrate and the organic light emitting device, wherein the phase delay layer, the multi-phase delay layer, and the linear polarization layer are sequentially disposed between the reflection film and the organic light emitting device.

17. An organic light emitting display device comprising:
a substrate;
a sealing member;
an active matrix type organic light emitting unit between the substrate and the sealing member, the active matrix type organic light emitting unit being configured to display an image and comprising an organic light emitting device;
a phase delay layer disposed with the substrate, the organic light emitting device, and the sealing member;
a linear polarization layer disposed with the substrate, the organic light emitting device, the sealing member, and the phase delay layer and to be in a location closer to a display surface of the organic light emitting display where the image is displayed than the organic light emitting device, the sealing member, and the phase delay layer are from the display surface;
a multi-phase delay layer between the phase delay layer and the linear polarization layer; and
a transmittance control layer disposed with the substrate, the organic light emitting device, the sealing member, the phase delay layer, the multi-phase delay layer, and the linear polarization layer.

18. The organic light emitting display device of claim 17, further comprising a cholesteric liquid crystal (CLC) layer disposed with the substrate, the organic light emitting device, the sealing member, and the phase delay layer and to be in a location further away from the display surface than the phase delay layer is from the display surface.

19. An organic light emitting display device comprising:
a substrate;
a sealing member;
a thin film transistor (TFT) electrically connected to an organic light emitting device, the TFT and the organic light emitting device being between the substrate and the sealing member;
a phase delay layer disposed with the substrate, the organic light emitting device, and the sealing member;
a linear polarization layer disposed with the substrate, the organic light emitting device, the sealing member, and the phase delay layer and to be in a location closer to a display surface of the organic light emitting display where the image is displayed than the organic light emitting device, the sealing member, and the phase delay layer are from the display surface;
a multi-phase delay layer between the phase delay layer and the linear polarization layer; and
a transmittance control layer disposed with the substrate, the organic light emitting device, the sealing member, the phase delay layer, the multi-phase delay layer, and the linear polarization layer.

20. The organic light emitting display device of claim 19, further comprising a cholesteric liquid crystal (CLC) layer disposed with the substrate, the organic light emitting device, the sealing member, and the phase delay layer and to be in a location further away from the display surface than the phase delay layer is from the display surface.

* * * * *